US012433126B2

(12) United States Patent
Sano et al.

(10) Patent No.: US 12,433,126 B2
(45) Date of Patent: Sep. 30, 2025

(54) LIGHT EMITTING APPARATUS, DISPLAY DEVICE, PHOTOELECTRIC CONVERSION DEVICE, ELECTRONIC APPARATUS, AND MOVING BODY

(71) Applicant: CANON KABUSHIKI KAISHA, Tokyo (JP)

(72) Inventors: Hiroaki Sano, Kanagawa (JP); Yojiro Matsuda, Kanagawa (JP); Koji Ishizuya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 390 days.

(21) Appl. No.: 18/297,063

(22) Filed: Apr. 7, 2023

(65) Prior Publication Data
US 2023/0345789 A1    Oct. 26, 2023

(30) Foreign Application Priority Data

Apr. 20, 2022 (JP) .................................. 2022-069596
Dec. 28, 2022 (JP) .................................. 2022-212107

(51) Int. Cl.
*H10K 59/122* (2023.01)
*H10K 59/35* (2023.01)
*H10K 59/65* (2023.01)

(52) U.S. Cl.
CPC ......... *H10K 59/353* (2023.02); *H10K 59/122* (2023.02); *H10K 59/65* (2023.02)

(58) Field of Classification Search
CPC .... H10K 59/353; H10K 59/122; H10K 59/65; H10K 59/19; H10K 59/879; H10K 59/90;
(Continued)

(56) References Cited

U.S. PATENT DOCUMENTS 7,474,295 B2    1/2009 Matsuda
7,492,348 B2    2/2009 Matsuda
(Continued)

FOREIGN PATENT DOCUMENTS

JP    2012-109214 A    6/2012
JP    2012-216338 A    11/2012
(Continued)

OTHER PUBLICATIONS

Oct. 18, 2024 Japanese Official Action in Japanese Patent Appln. No. 2022-212107.
(Continued)

*Primary Examiner* — Donald L Raleigh
(74) *Attorney, Agent, or Firm* — Venable LLP

(57) ABSTRACT

A light emitting apparatus having sub-pixels including a first sub-pixel, a second sub-pixel, and a third sub-pixel. One sub-pixel of the first sub-pixel, the second sub-pixel, and the third sub-pixel is adjacent to the remaining two sub-pixels. Each sub-pixel includes a lower electrode, a bank including an opening that exposes a center portion of the lower electrode, an organic compound layer arranged to cover the lower electrode and the bank and including a light emitting layer, and an upper electrode arranged on the organic compound layer. The bank of the first sub-pixel includes a first separation structure that at least partially surrounds the opening arranged on the lower electrode of the first sub-pixel. The bank of the third sub-pixel does not include a separation structure arranged to surround the opening of the third sub-pixel.

21 Claims, 22 Drawing Sheets

(58) Field of Classification Search
CPC ...... H10K 59/352; H10K 50/13; H10K 59/35; H10K 59/8051; H10K 59/8052
See application file for complete search history.

(56) References Cited

U.S. PATENT DOCUMENTS

| | | | |
|---|---|---|---|
| 8,068,089 | B2 | 11/2011 | Matsuda |
| 8,482,515 | B2 | 7/2013 | Matsuda |
| 11,393,879 | B2 | 7/2022 | Sano |
| 12,048,215 | B2 | 7/2024 | Lee |
| 2012/0104368 | A1 | 5/2012 | Isobe |
| 2012/0248475 | A1 | 10/2012 | Yamada et al. |
| 2019/0378450 | A1* | 12/2019 | Matsuda ............. G09G 3/2003 |
| 2020/0212133 | A1 | 7/2020 | Gee et al. |
| 2021/0305323 | A1 | 9/2021 | Ishizuya |
| 2021/0351248 | A1 | 11/2021 | Lee |
| 2022/0085125 | A1* | 3/2022 | Yun ..................... H10K 59/124 |
| 2022/0115447 | A1 | 4/2022 | Ishizuya |
| 2022/0131112 | A1 | 4/2022 | Hinata |
| 2022/0255042 | A1 | 8/2022 | Naruse et al. |
| 2023/0189555 | A1 | 6/2023 | Ito |
| 2023/0189557 | A1 | 6/2023 | Takahashi |
| 2024/0349566 | A1 | 10/2024 | Lee |

FOREIGN PATENT DOCUMENTS

| | | |
|---|---|---|
| JP | 2021-072282 A | 5/2021 |
| KR | 10-2020-0001716 A | 1/2020 |
| KR | 10-2021-0137823 A | 11/2021 |
| WO | 2021/085187 A1 | 5/2021 |

OTHER PUBLICATIONS

Feb. 2, 2025 Korean Official Action in Korean Patent Appln. No. 10-2023-043288.

Sep. 13, 2023 European Official Action in European Patent Appln. No. 23163632.5.

* cited by examiner

F I G. 10
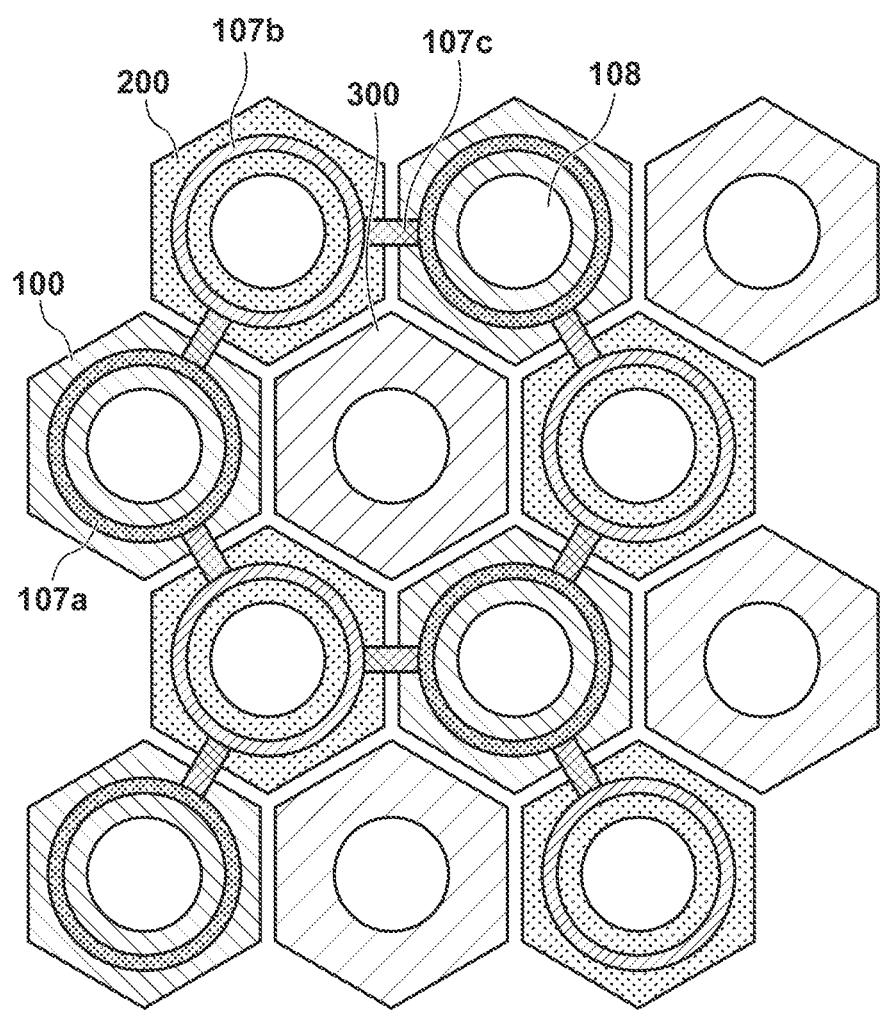

LIGHT EMITTING APPARATUS, DISPLAY DEVICE, PHOTOELECTRIC CONVERSION DEVICE, ELECTRONIC APPARATUS, AND MOVING BODY

BACKGROUND OF THE INVENTION

Field of the Invention

The present invention relates to a light emitting apparatus, a display device, a photoelectric conversion device, an electronic apparatus, and a moving body.

Description of the Related Art

An organic light emitting element is a light emitting apparatus that includes a first electrode, a second electrode, and an organic compound layer arranged between these, and emits light when carriers are injected from the first electrode and the second electrode to the organic compound layer. The organic light emitting element is a lightweight device that can be made flexible. To implement a high-resolution display device including an organic light emitting element, a method (to be referred to as a white+CF method hereinafter) using organic light emitting elements configured to emit white light and color filters is known. In the white+CF method, an organic layer is formed over the entire substrate. For this reason, a high resolution can relatively easily be obtained using a pixel size and the pitch between pixels as compared to a method of forming an organic layer for each color using a metal mask.

In a display device having a configuration in which an organic compound layer is shared by a plurality of organic light emitting elements, charges supplied from the first electrode of one organic light emitting element are sometimes supplied to an adjacent organic light emitting element via the organic compound layer. This phenomenon can be observed as a leakage current between the organic light emitting elements. To reduce the leakage current, various studies have actively been made.

Japanese Patent Laid-Open No. 2012-216338 describes a display device including a plurality of first electrodes provided on a plurality of organic EL elements, respectively, an insulating film provided between the plurality of first electrodes, an organic layer provided on the plurality of first electrodes and the insulating film, and a second electrode provided on the organic layer. The organic layer and the second electrode are provided to be shared by the plurality of organic EL elements (the plurality of first electrodes). The insulating film includes trenches at positions between the plurality of organic EL elements. The organic layer includes a hole injection layer or a hole transport layer, and a light emitting layer. The thickness of the hole injection layer or the hole transport layer in the trench is less than the thickness outside the trench. According to Japanese Patent Laid-Open No. 2012-216338, this configuration can suppress leakage of a driving current between adjacent organic EL elements.

In the configuration described in Japanese Patent Laid-Open No. 2012-216338, since the trenches are formed in all positions between adjacent organic EL elements (sub-pixels), the light emitting region is small. If the light emitting region is small, it is necessary to increase the current density to obtain a required luminance, and this may shorten the light emission life of the organic light emitting element.

SUMMARY OF THE INVENTION

The present invention provides a technique advantageous in suppressing reduction of the area of a light emitting region while suppressing a leakage current between sub-pixels.

One of aspect of the present invention provides a light emitting apparatus comprising a plurality of sub-pixels including a first sub-pixel, a second sub-pixel, and a third sub-pixel, in which one sub-pixel of the first sub-pixel, the second sub-pixel, and the third sub-pixel is adjacent to the remaining two sub-pixels, wherein each of the plurality of sub-pixels includes a lower electrode, a bank including an opening that exposes a center portion of the lower electrode, an organic compound layer arranged to cover the lower electrode and the bank and including a light emitting layer, and an upper electrode arranged on the organic compound layer, the bank of the first sub-pixel includes a first separation structure that at least partially surrounds the opening arranged on the lower electrode of the first sub-pixel, and the bank of the third sub-pixel does not include a separation structure arranged to surround the opening of the third sub-pixel.

Further features of the present invention will become apparent from the following description of exemplary embodiments with reference to the attached drawings.

BRIEF DESCRIPTION OF THE DRAWINGS

FIG. 10 is a plan view showing an example of the arrangement of a first sub-pixel, a second sub-pixel, and a third sub-pixel in the light emitting apparatus according to the second embodiment;

DESCRIPTION OF THE EMBODIMENTS

Figure 1:
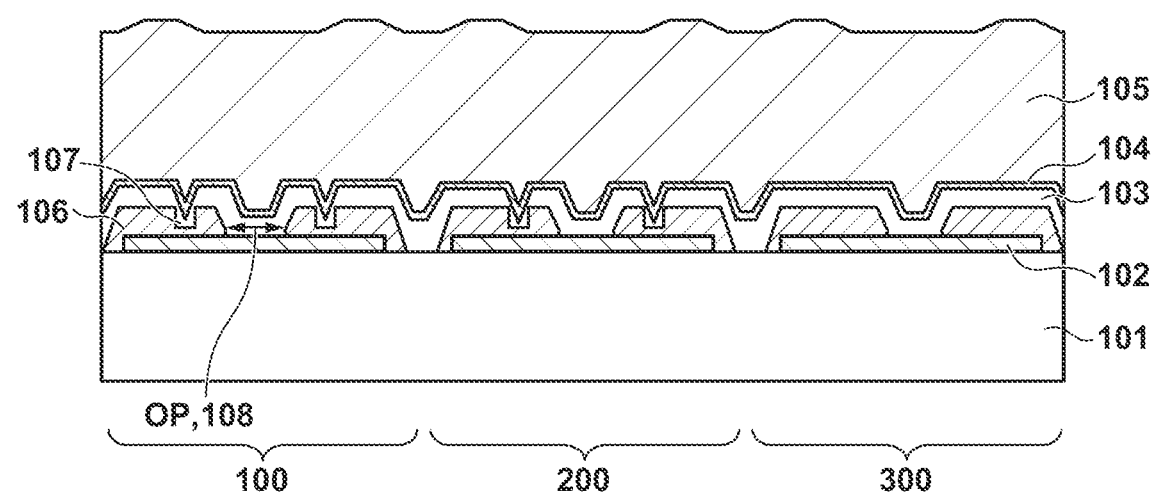
FIG. 1 is a sectional view exemplarily showing the configuration of a light emitting apparatus according to the first and second embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a sectional view showing an example of the configuration of a first sub-pixel 100, a second sub-pixel 200, and a third sub-pixel 300 of a light emitting apparatus 1 according to the first embodiment. The light emitting apparatus 1 includes a plurality of sub-pixels (organic light emitting elements), and the plurality of sub-pixels include the first sub-pixel 100, the second sub-pixel 200, and the third sub-pixel 300. The first sub-pixel 100, the second sub-pixel 200, and the third sub-pixel 300 are arranged such that one sub-pixel of the first sub-pixel 100, the second sub-pixel 200, and the third sub-pixel 300 is adjacent to the remaining two sub-pixels. The light emitting apparatus 1 can include, on a substrate 101, a plurality of lower electrodes 102, an insulating layer 106, a functional layer (organic compound layer) 103 including a light emitting layer, an upper electrode 104, and a protection layer 105.

The insulating layer 106 can include an opening OP that exposes the center portion of (the upper surface of) each lower electrode 102. In another viewpoint, the insulating layer 106 can be arranged to cover the peripheral portion of (the upper surface of) the lower electrode 102 and not to cover the center portion that is the portion inside the peripheral portion. The insulating layer 106 is also called a pixel separation film or a bank. The insulating layer 106 can be configured to have a plurality of banks. The plurality of banks may be arranged apart from each other or may be connected to each other. The insulating layer (bank) 106 can include a trench 107 serving as a separation structure. The trench 107 can be arranged on, for example, the lower electrode 102 but may be arranged on a region surrounding the lower electrode 102. The insulating layer 106 can be arranged in contact with not only the peripheral portion of the upper surface of the lower electrode 102 but also the side surface of the lower electrode 102. The functional layer 103 can contact a portion of the upper surface of the lower electrode 102 not covered with the insulating layer 106, that is, the center portion. A region where the lower electrode 102 and the functional layer 103 are in contact is a light emitting region 108 that emits light when an electric field is applied between the lower electrode 102 and the upper electrode 104. The functional layer 103 can be arranged to be shared by the plurality of sub-pixels. There is a possibility that charges supplied from the lower electrode 102 are supplied to an adjacent sub-pixel via the functional layer 103.

Figure 2:
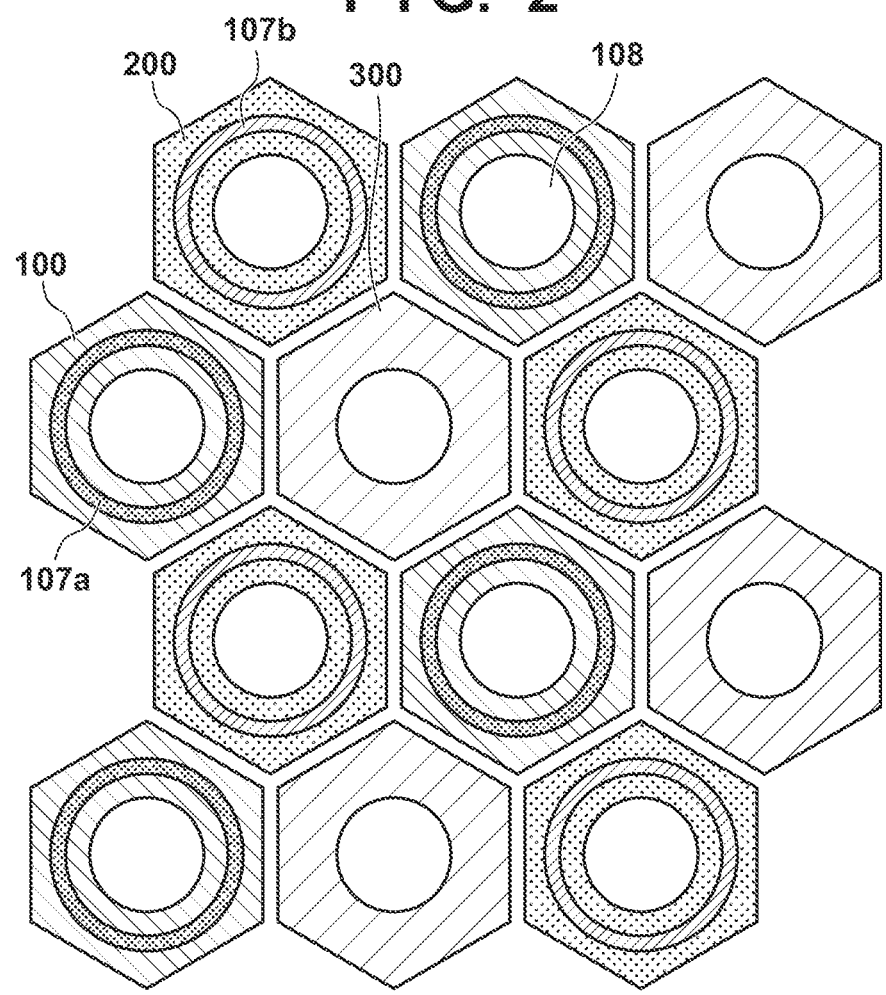
FIG. 2 is a plan view showing an example of the arrangement of a first sub-pixel, a second sub-pixel, and a third sub-pixel in the light emitting apparatus according to the first embodiment.

FIG. 2 is a plan view showing an example of the arrangement of the first sub-pixel 100, the second sub-pixel 200, and the third sub-pixel 300 in the light emitting apparatus 1 shown in FIG. 1. The first sub-pixel 100, the second sub-pixel 200, and the third sub-pixel 300 are sub-pixels that generate light in wavelength bands different from each other. One sub-pixel of the first sub-pixel 100, the second sub-pixel 200, and the third sub-pixel 300 is adjacent to the remaining two sub-pixels. In another viewpoint, in the example shown in FIG. 2, the first sub-pixel 100, the second sub-pixel 200, and the third sub-pixel 300 can be arranged to be adjacent to each other.

The insulating layer (bank) 106 of the first sub-pixel 100 can include a trench 107a arranged to at least partially surround the light emitting region 108 or the opening OP of the first sub-pixel 100. In the example shown in FIG. 2, the trench 107a is arranged to surround the whole circumference of the light emitting region 108 or the opening OP of the first sub-pixel 100. The insulating layer (bank) 106 of the second sub-pixel 200 can include a trench 107b arranged to at least partially surround the light emitting region 108 or the opening OP of the second sub-pixel 200. In the example shown in FIG. 2, the trench 107b is arranged to surround the whole circumference of the light emitting region 108 or the opening OP of the second sub-pixel 200. Hereinafter, when explaining the trench 107a and the trench 107b without discriminating these from each other, these will be described as the trench 107. The mode in which the trench 107 at least partially surrounds the opening OP can include a configuration in which, for example, an interior angle made by two line segments connecting the center of the opening OP and two end portions of the trench 107 is 180° or more. For example, if the trench 107 has a circular shape, the mode can include a configuration in which the trench 107 has at least a semicircular shape. If the trench 107 surrounding one sub-pixel is divided, the mode can include a configuration in which an interior angle made by line segments connecting the center of the opening OP and two end portions of the trench 107 is obtained for each trench 107, and the sum of the interior angles for the trenches 107 is 180° or more.

The insulating layer (bank) 106 of the third sub-pixel 300 does not include a separation structure arranged to surround the opening OP of the third sub-pixel 300. Alternatively, the insulating layer 106 of the third sub-pixel 300 does not include, between the opening OP of the third sub-pixel 300 and the other sub-pixels 100 and 200 arranged to be adjacent to the third sub-pixel 300 and surround the third sub-pixel 300, a separation structure arranged to surround the third sub-pixel 300.

Figure 3:
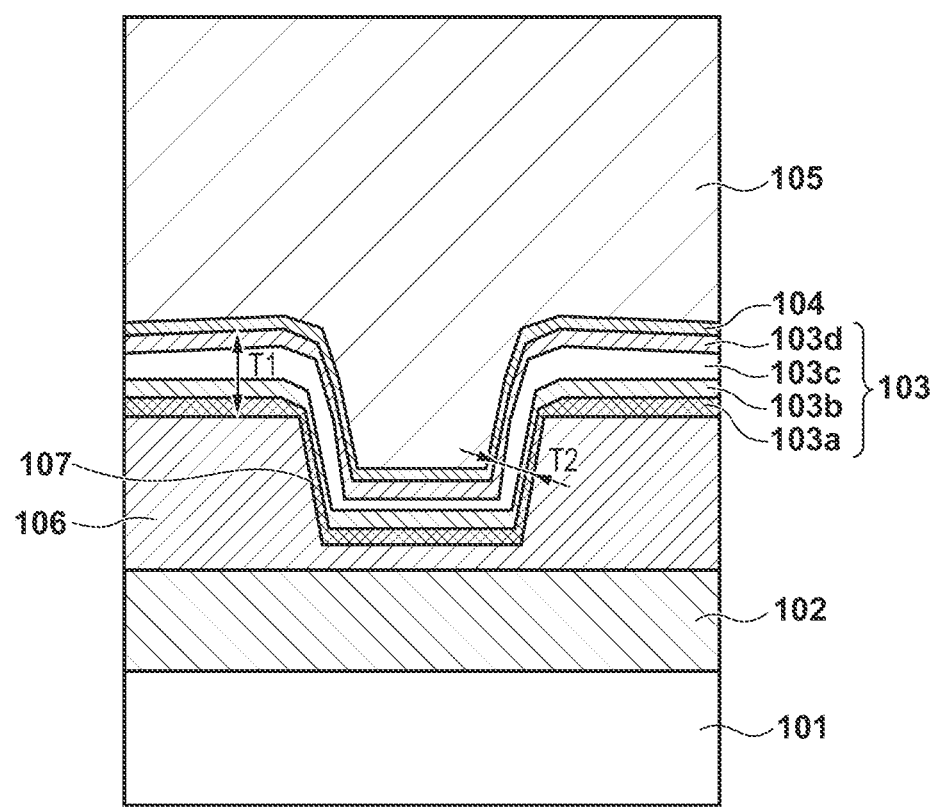
FIG. 3 is a schematic sectional view showing the vicinity of a trench shown in FIG. 1 in an enlarged state.

FIG. 3 is a schematic sectional view showing the vicinity of the trench 107 shown in FIG. 1 in an enlarged state. On the substrate 101, the lower electrode 102, the insulating layer 106, the functional layer 103, the upper electrode 104, and the protection layer 105 are arranged. The trench 107 is arranged in the insulating layer 106. In another viewpoint, the trench 107 is arranged under the functional layer 103. The functional layer 103 is shared by the plurality of sub-pixels or organic light emitting elements. The functional layer 103 can include, for example, a hole injection layer 103a, a hole transport layer 103b, a light emitting layer 103c, and an electron transport layer 103d.

A thickness T2 of the functional layer 103 on the side wall of the trench 107 of the insulating layer 106 is less than a thickness T1 of the functional layer 103 on the flat portion of the insulating layer 106 with a flat upper surface. The hole injection layer 103a and the hole transport layer 103b have a relatively high conductivity. However, when the thickness T2 of the functional layer 103 on the side wall of the trench 107 is decreased, the resistance of the hole injection layer 103a and the hole transport layer 103b can be made high. As a result, when the trench 107 is provided, the leakage current between the adjacent sub-pixels (organic light emitting elements) is suppressed, and color mixing between the sub-pixels whose light emission colors are different from each other is suppressed. For example, the leakage current (color mixing) between the first sub-pixel 100 and the third sub-pixel 300 is suppressed by the trench 107a, and the leakage current (color mixing) between the second sub-pixel 200 and the third sub-pixel 300 is suppressed by the trench 107b. In addition, the leakage current (color mixing) between the first sub-pixel 100 and the second sub-pixel 200 is suppressed by the trench 107a and the trench 107b. Since the two trenches 107a and 107b exist between the first sub-pixel 100 and the second sub-pixel 200, the leakage current (color mixing) between the first sub-pixel 100 and the second sub-pixel 200 is effectively suppressed.

The light emitting region 108 can have, for example, a circular shape, but may have another shape such as a polygonal shape. Similarly, the trench 107 can have, for example, a circular shape, but may have another shape such as a polygonal shape. The light emitting region 108 and the trench 107 can have shapes similar to each other but may not. The separation structure may be implemented by a convex structure or an electrode in place of the trench 107. A predetermined voltage can be applied to the electrode.

The trench 107 and the light emitting region 108 are not connected. This is because if the trench 107 and the light emitting region 108 are connected, light emission occurs on or inside the trench 107 as well, and light emission becomes uneven as a whole.

Figure 4:
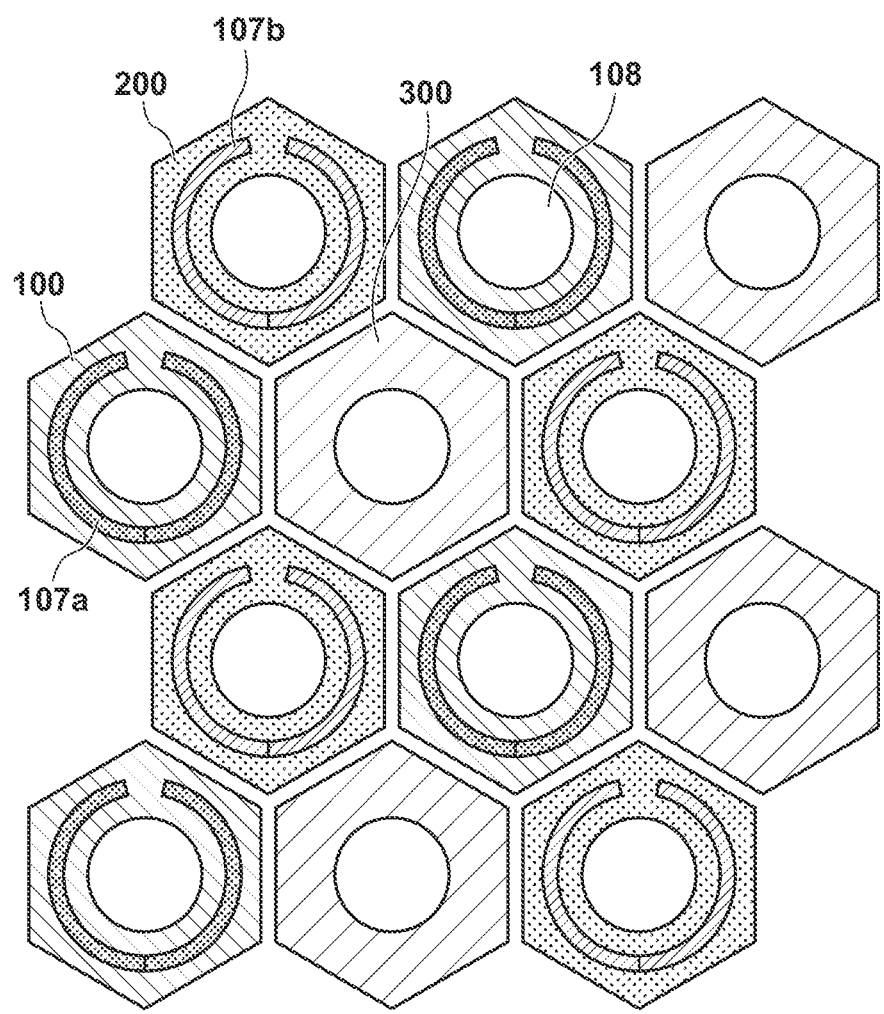
FIG. 4 is a plan view showing the first modification of the first embodiment.
Figure 5:
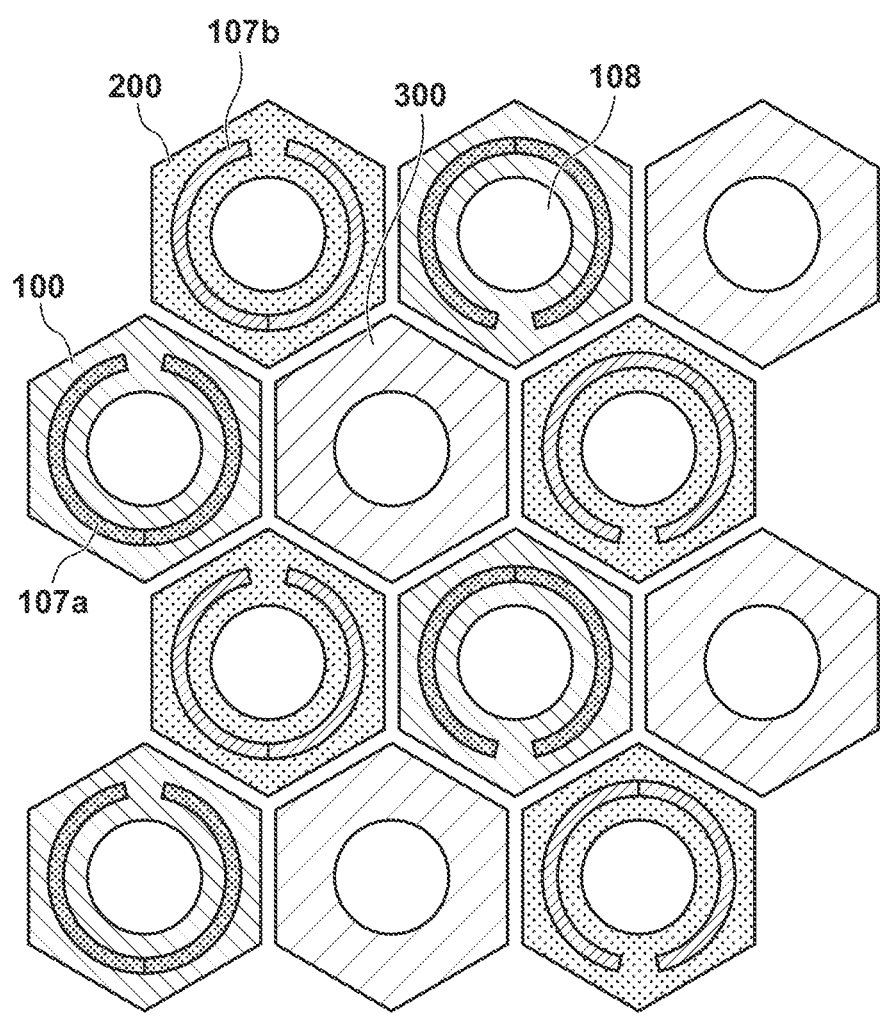
FIG. 5 is a plan view showing the second modification of the first embodiment.
Figure 6:
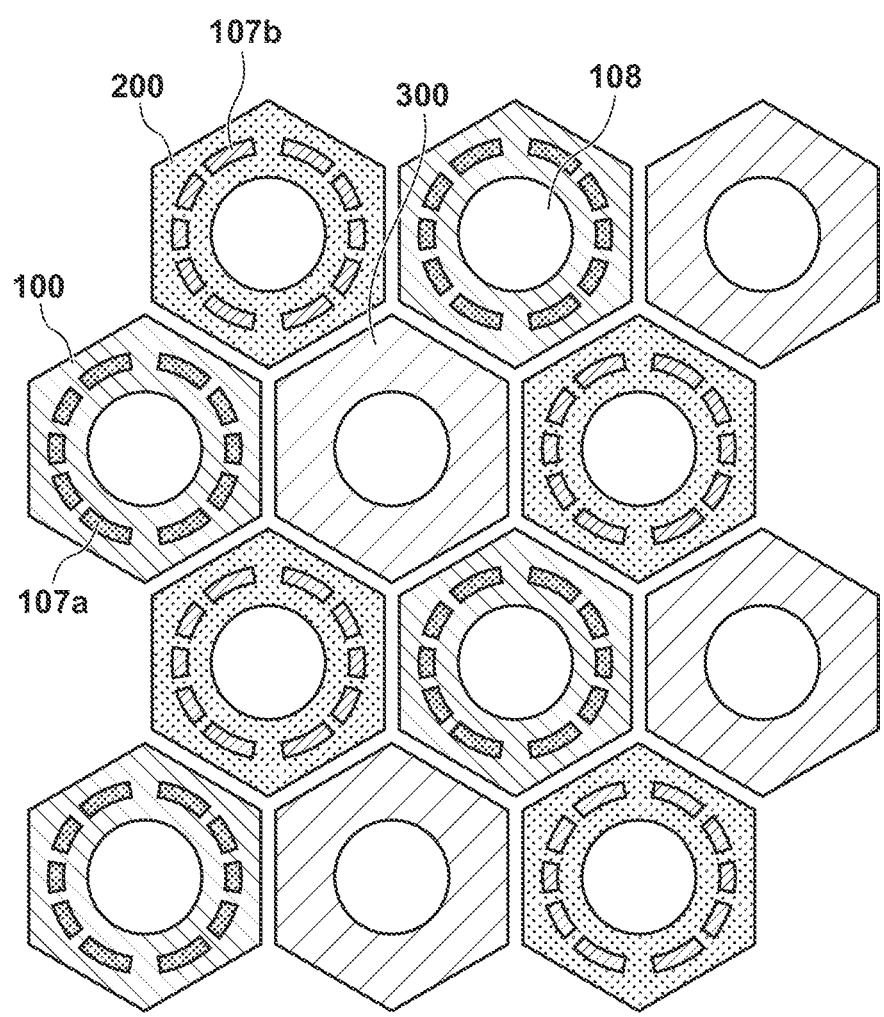
FIG. 6 is a plan view showing the third modification of the first embodiment.

FIGS. 4 to 6 show three modifications of the first embodiment. In the modifications shown in FIGS. 4 to 6, the trench 107a partially surrounds the light emitting region inside it, and the trench 107b partially surrounds the light emitting region inside it. In these modifications as well, the leakage current between the sub-pixels is suppressed.

Figure 25:
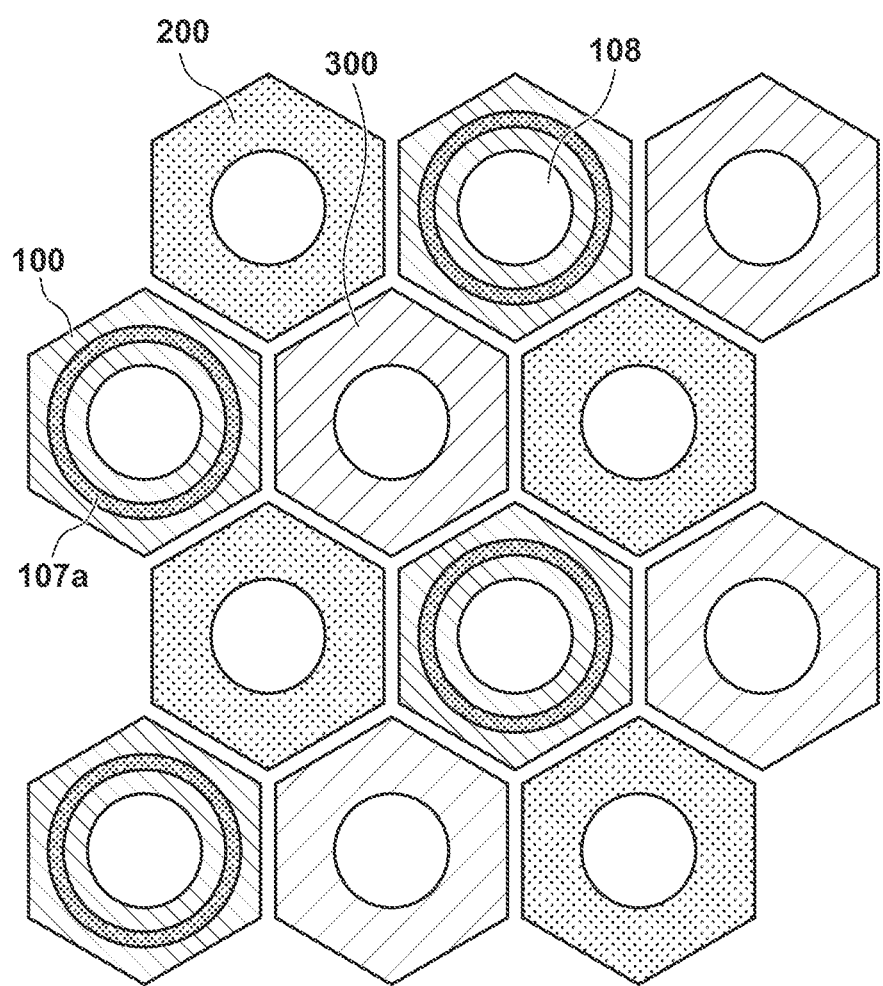
FIG. 25 is a plan view showing the fifth modification of the first embodiment.
Figure 26:
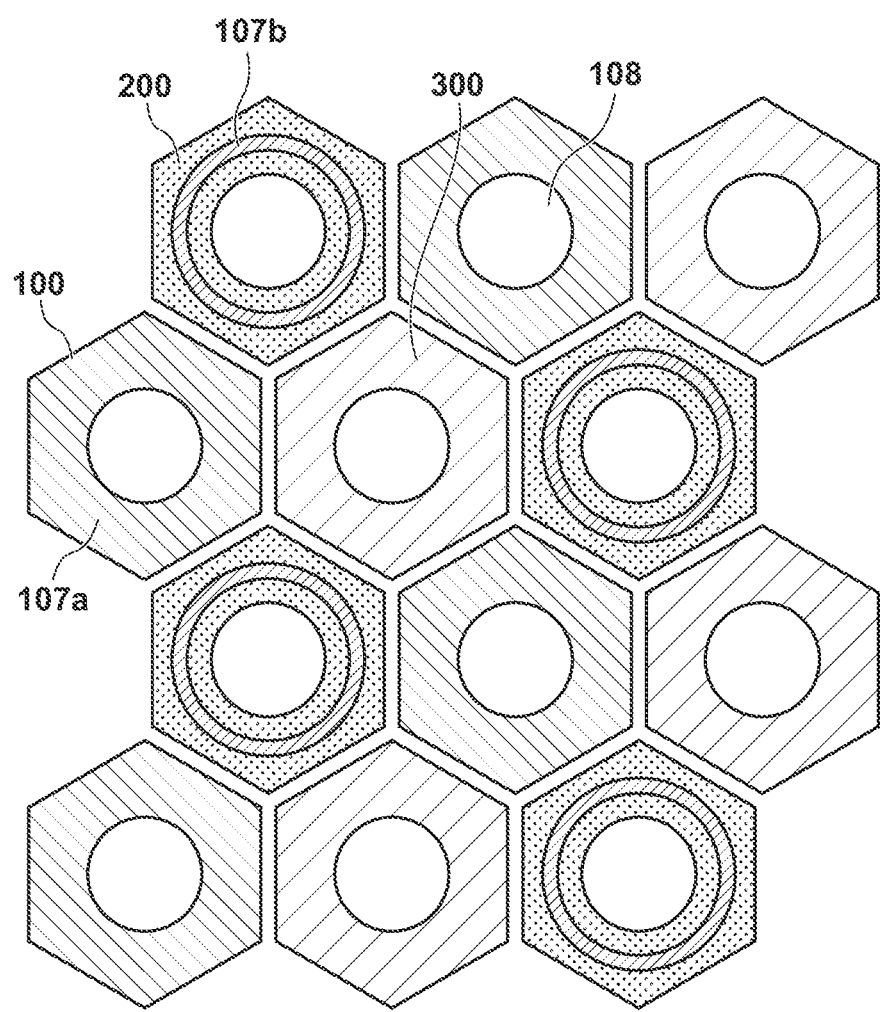
FIG. 26 is a plan view showing the sixth modification of the first embodiment.

FIG. 25 shows another modification. In the other modification shown in FIG. 25, the trench 107a is arranged to surround the whole circumference of the light emitting region 108 (opening) of the first sub-pixel 100. The second sub-pixel 200 and the third sub-pixel 300 do not include a separation structure arranged to surround the light emitting region 108 (opening). FIG. 26 shows still another modification. In the still other modification shown in FIG. 26, the trench 107b is arranged to surround the whole circumference of the light emitting region 108 (opening) of the second sub-pixel 200. The first sub-pixel 100 and the third sub-pixel 300 do not include a separation structure arranged to surround the light emitting region 108 (opening). Even in such a form, the leakage current between the sub-pixels is suppressed.

Figure 7:
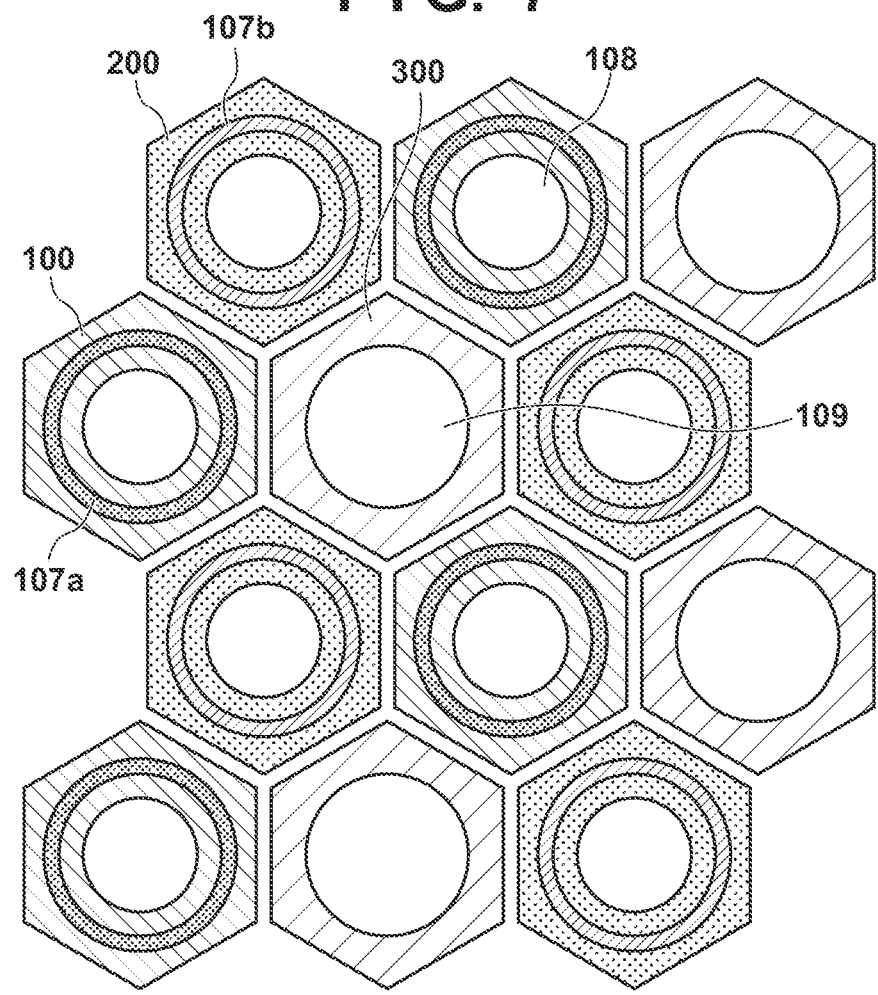
FIG. 7 is a plan view showing the fourth modification of the first embodiment.

FIG. 7 shows still another modification of the first embodiment. In the modification shown in FIG. 7, the opening OP or a light emitting region 109 of the third sub-pixel 300 is larger than the opening OP or the light emitting region 108 of the first sub-pixel 100 and the opening OP or the light emitting region 108 of the second sub-pixel 200. This configuration can be brought about by the third sub-pixel 300 not having the separation structure or the trench 107. The expansion of the light emitting region 108 enables lowering of the current density needed to obtain a desired luminance, and this can contribute to extension of the life. Using the third sub-pixel 300 not having the separation structure or the trench 107, the light emitting region 109 of the third sub-pixel 300 is expanded, and simultaneously, the light emitting regions 108 of the first sub-pixel 100 and the second sub-pixel 200 may be expanded. This means that the area ratio of the first sub-pixel 100 and the second sub-pixel 200 to the area ratio of the third sub-pixel 300 is increased. This makes it possible to prolong the lives of al the first sub-pixel 100, the second sub-pixel 200, and the third sub-pixel 300 and consequently prolong the life of the light emitting apparatus 1.

Figure 8:
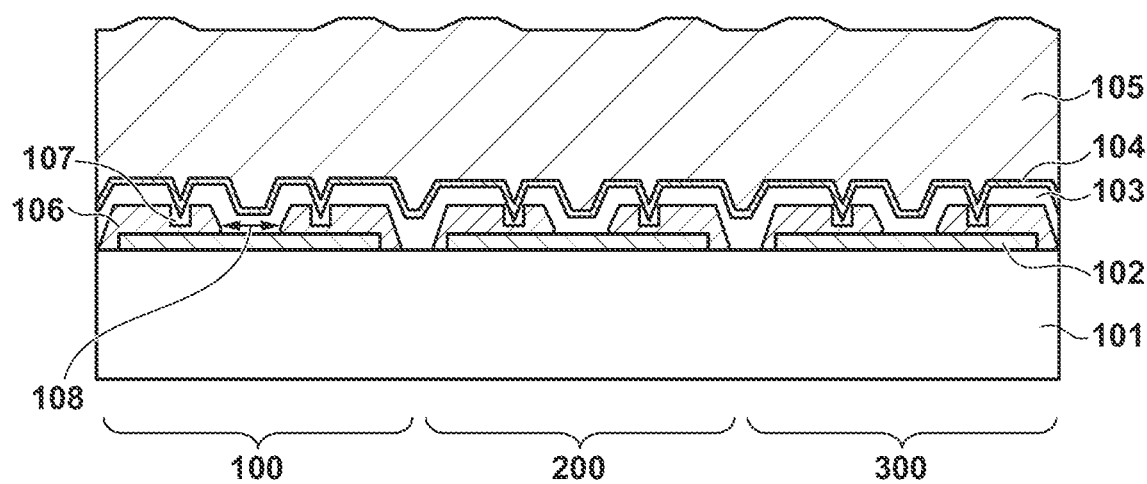
FIG. 8 is a sectional view showing the configuration of a light emitting apparatus according to a comparative example.
Figure 9:
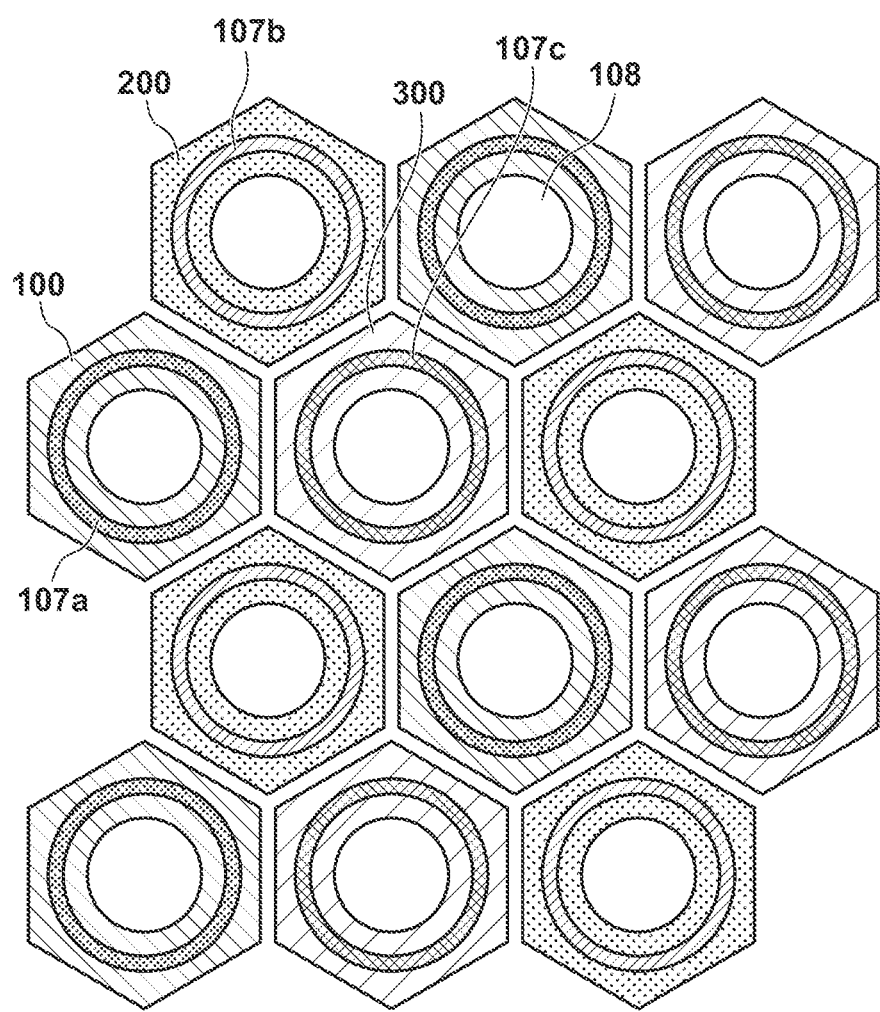
FIG. 9 is a plan view showing the configuration of the light emitting apparatus according to the comparative example.

FIGS. 8 and 9 show a light emitting apparatus according to a comparative example. In the comparative example, each of the first sub-pixel 100, the second sub-pixel 200, and the third sub-pixel 300 includes the trench 107 or the separation structure to surround the light emitting region 108. In this configuration, since the light emitting region of the third sub-pixel 300 is limited, the current density needed to obtain a desired luminance is larger than in the first embodiment, and this is therefore less advantageous in terms of life than in the first embodiment.

Second Embodiment

A light emitting apparatus 1 according to the second embodiment will be described below. Matters that are not mentioned as the second embodiment can comply with the first embodiment. The second embodiment may be understood as a modification of the first embodiment. FIG. 1 is diverted as a sectional view showing an example of the configuration of a first sub-pixel 100, a second sub-pixel 200, and a third sub-pixel 300 of the light emitting apparatus 1 according to the second embodiment.

FIG. 10 is a plan view showing an example of the arrangement of the first sub-pixel 100, the second sub-pixel 200, the third sub-pixel 300, and a trench 107 in the light emitting apparatus 1 according to the second embodiment. In the second embodiment, a connecting trench 107c serving as a connecting separation structure is added to the first embodiment. The connecting trench 107c extends to connect a first trench 107a and a second trench 107b. The connecting separation structure may be implemented by a convex structure or an electrode in place of the trench 107c. The connecting trenches 107c can be arranged to be connected to none of an opening OP of the first sub-pixel 100, the opening OP of the second sub-pixel 200, and the opening OP of the third sub-pixel 300. The connecting trenches 107c can connect the first separation structures 107a and the second separation structures 107b to surround the opening OP of the third sub-pixel 300. One third sub-pixel 300 can be at least partially surrounded by an aggregate of the plurality of trenches 107a, the plurality of trenches 107b, and the plurality of trenches 107c.

When the trenches 107a, 107b, and 107c are provided, the leakage current between the adjacent sub-pixels (organic light emitting elements) is suppressed, and color mixing between the sub-pixels whose light emission colors are different from each other is suppressed. For example, the leakage current (color mixing) between the first sub-pixel 100 and the third sub-pixel 300 is suppressed by the trench 107a, and the leakage current (color mixing) between the second sub-pixel 200 and the third sub-pixel 300 is suppressed by the trench 107b. In addition, the leakage current (color mixing) between the first sub-pixel 100 and the second sub-pixel 200 is suppressed by the trench 107a and the trench 107b. Since the three trenches 107a, 107b, and 107c exist between the first sub-pixel 100 and the second sub-pixel 200, the leakage current (color mixing) between the first sub-pixel 100 and the second sub-pixel 200 is effectively suppressed. Also, the leakage current between the third sub-pixel 300 and sub-pixels arranged in close vicinity to the outside of the trenches 107a, 107b, and 107c surrounding the third sub-pixel 300 is suppressed by the trenches 107a, 107b, and 107c.

Figure 11:
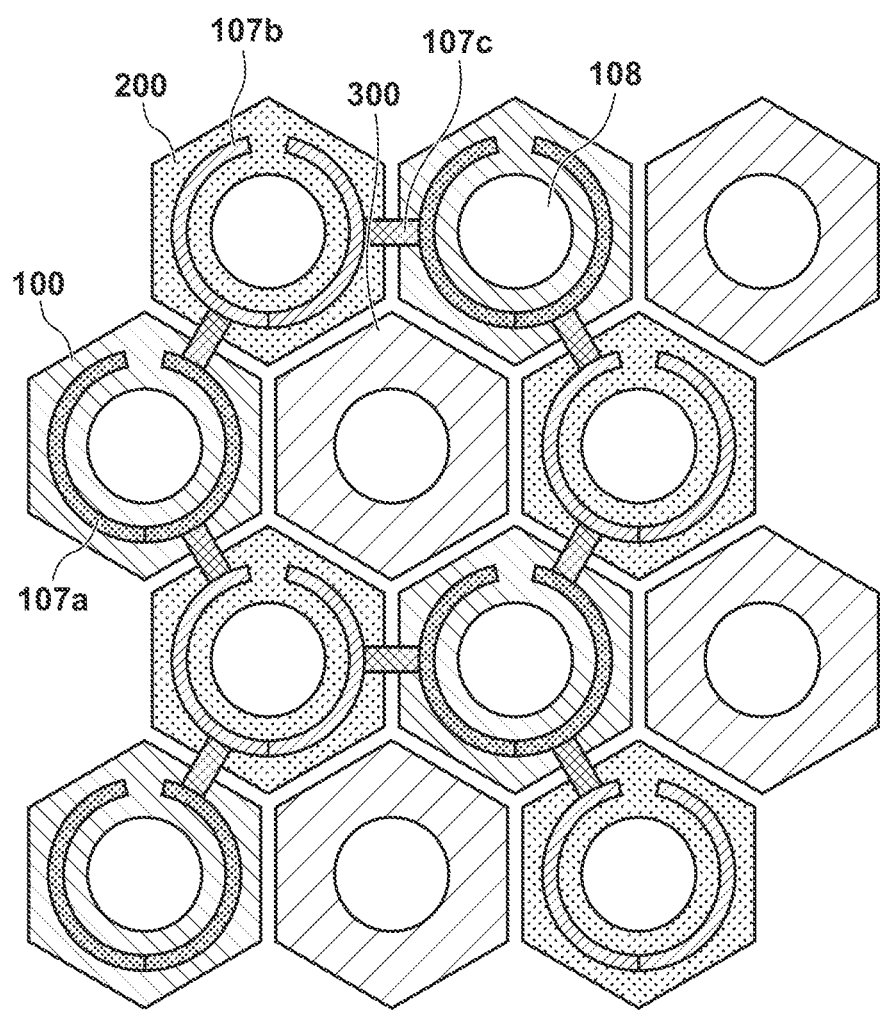
FIG. 11 is a plan view showing the first modification of the second embodiment.
Figure 12:
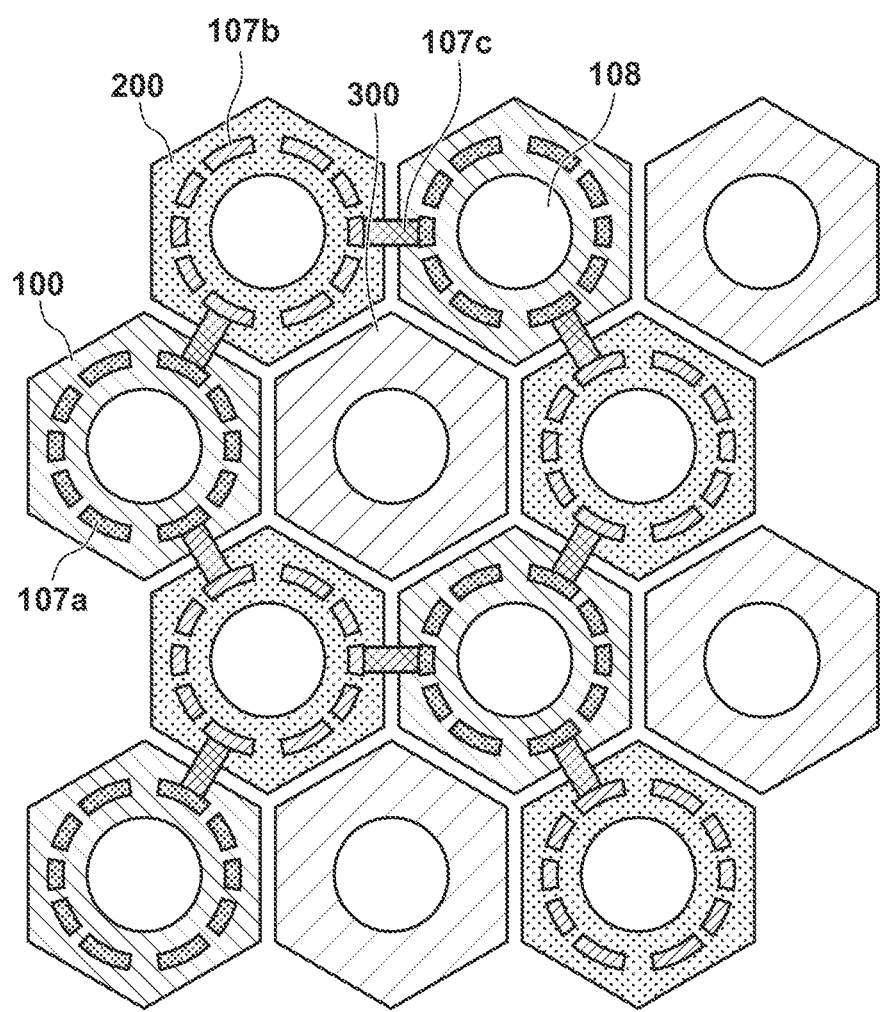
FIG. 12 is a plan view showing the second modification of the second embodiment.
Figure 13:
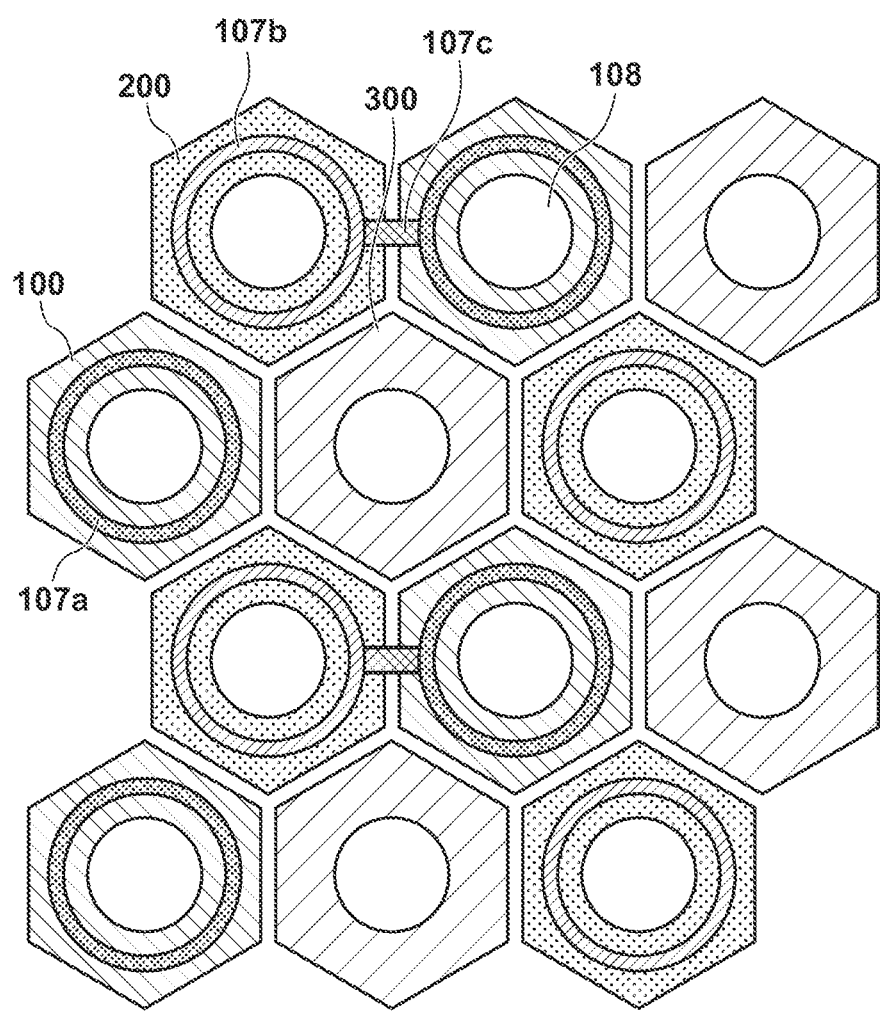
FIG. 13 is a plan view showing the third modification of the second embodiment.

FIGS. 11 to 13 show three modifications of the second embodiment. In the modifications shown in FIGS. 11 and 12, the trench 107a partially surrounds the light emitting region inside it, and the trench 107b partially surrounds the light emitting region inside it. In the modification shown in FIG. 13, the trenches 107a, 107b, and 107c partially surround the light emitting region of the third sub-pixel 300 arranged inside these. In these modifications as well, the leakage current between the sub-pixels is suppressed.

Figure 14:
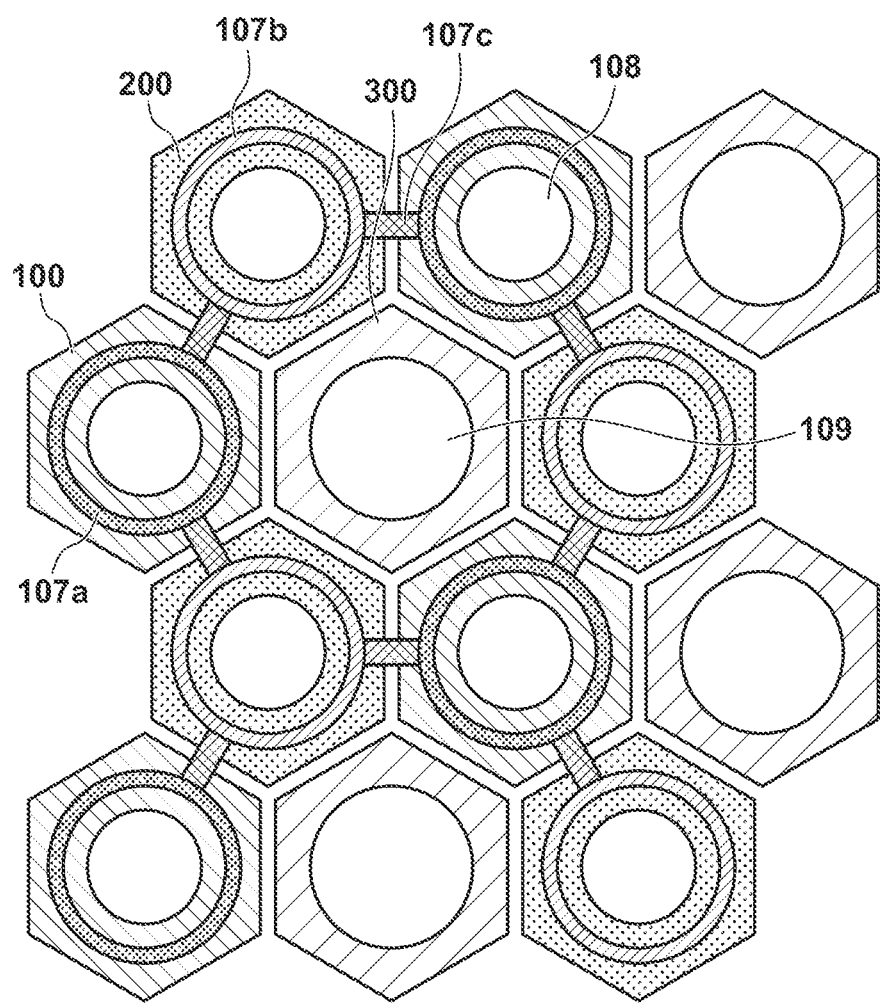
FIG. 14 is a plan view showing the fourth modification of the second embodiment.

FIG. 14 shows another modification of the second embodiment. In the other modification shown in FIG. 14, the opening OP or a light emitting region 109 of the third sub-pixel 300 is larger than the opening OP or a light emitting region 108 of the first sub-pixel 100 and the opening OP or the light emitting region 108 of the second sub-pixel 200. This configuration can be brought about by the third sub-pixel 300 not having the separation structure or the trench 107. The expansion of the light emitting region 108 enables lowering of the current density needed to obtain a desired luminance, and this can contribute to extension of the life. Using the third sub-pixel 300 not having the separation structure or the trench 107, the light emitting region 109 of the third sub-pixel 300 is expanded, and simultaneously, the light emitting regions 108 of the first sub-pixel 100 and the second sub-pixel 200 may be expanded. This means that the area ratio of the first sub-pixel 100 and the second sub-pixel 200 to the area ratio of the third sub-pixel 300 is increased. This makes it possible to prolong the lives of al the first sub-pixel 100, the second sub-pixel 200, and the third sub-pixel 300 and consequently prolong the life of the light emitting apparatus 1.

Third Embodiment

Figure 15:
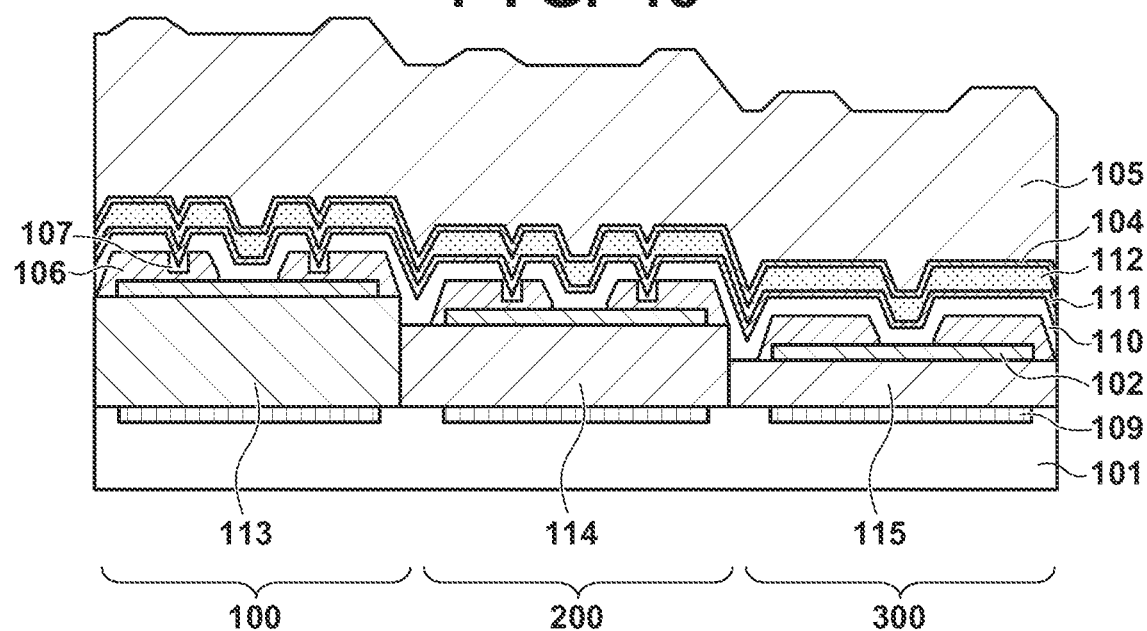
FIG. 15 is a sectional view exemplarily showing the configuration of a light emitting apparatus according to the third embodiment.

A light emitting apparatus 1 according to the third embodiment will be described below. Matters that are not mentioned as the third embodiment can comply with the first or second embodiment. The third embodiment may be understood as a modification of the first or second embodiment. FIG. 15 is a sectional view showing an example of the configuration of a first sub-pixel 100, a second sub-pixel 200, and a third sub-pixel 300 of the light emitting apparatus 1 according to the third embodiment.

In the third embodiment, a reflection layer 109 is added to the first or second embodiment, and the functional layer 103 is replaced with a functional layer 110 including a first light emitting layer, a charge generation layer 111, and a functional layer 112 including a second light emitting layer. The light emitting apparatus 1 according to the third embodiment is a tandem type including the functional layer 110 including the first light emitting layer, the charge generation layer 111, and the functional layer 112 including the second light emitting layer.

The charge generation layer 111 is a layer that generates holes and electrons when a voltage is applied between a lower electrode 102 and an upper electrode 104. The charge generation layer 111 contains a compound that readily accepts electrons from another organic compound. The charge generation layer 111 may be a combination of, for example, an alkali metal and a compound whose lowest unoccupied molecular orbital energy level is −5.0 eV or less, and can function as a charge generation layer. The alkali metal can be, for example, Li, and Li may be contained as a metal, a part of a compound, or a part of an organometallic complex. The compound whose lowest unoccupied molecular orbital energy level is −5.0 eV or less can be, for example, a hexaazatriphenylene compound, a radialene compound, or hexafluoroquinodimethane. However, the compound is not limited to these. If the lowest unoccupied molecular orbital energy level is so low that electrons are extracted from the highest occupied molecular orbit of the alkali metal, charges can be generated. Since positive or negative charges are thus generated in the charge generation layer 111, the positive or negative charges can be supplied to the layers on the upper and lower sides of the charge generation layer. That is, when an electric field is applied between the lower electrode 102 and the upper electrode 104, carriers are generated in the charge generation layer 111. The carriers are supplied to the functional layer 110 including the first light emitting layer and the functional layer 112 including the second light emitting layer, and both can efficiently be caused to emit light.

In the third embodiment, to optimize the optical distance between the upper surface of the reflection layer 109 and the light emitting position of the light emitting layer of each color, the first sub-pixel 100 includes an insulating layer 113, the second sub-pixel 200 includes an insulating layer 114, and the third sub-pixel 300 includes an insulating layer 115. Letting Lr be the optical path length from the upper surface of the reflection layer 109 to the light emitting position of the functional layer 110 including the first light emitting layer, and Φr be the phase shift in the reflection layer 109, we obtain $$Lr=(2m-(\Phi r/\pi))\times(\lambda/4) \quad (1)$$

where m is an integer of 0 or more. The optical distances of the insulating layers 113, 114, and 115 are adjusted such that equation (1) is approximately satisfied.

Letting Φs be the phase shift when light with the wavelength λ is reflected by the reflection surface, an optical distance Ls from the light emitting position to the reflection surface of the upper electrode 104 approximately satisfies equation (2) below. In this configuration, m'=0.

$$Ls=(2m'-(\Phi s/\pi))\times(\lambda/4)=-(\Phi s/\pi)\times(\lambda/4) \quad (2)$$

Hence, total layer interference L approximately satisfies a condition given by $$L=Lr+L=(2m-\varphi/\pi)\times(\lambda/4) \quad (3)$$

Here, Φ is the sum of phase shifts when the light with the wavelength λ is reflected by the reflection layer 109 and the upper electrode 104, that is, Φr+Φs.

The charge generation layer 111 can be shared by a plurality of sub-pixels. However, since the charge generation layer 111 generates charges when an electric field is applied, it generates charges when an electric field is applied even between the sub-pixels. Since the generated charges can reach adjacent pixels via the functional layer that is not divided between the sub-pixels, unintended light emission may occur.

In this embodiment, a trench 107 is provided in an insulating layer 106. Hence, the charge generation layer 111 on the side wall of the trench 107 can be formed thinner than the charge generation layer 111 on the flat portion of the insulating layer 106 with a flat upper surface. The charge generation layer 111 has a relatively high conductivity. However, when the charge generation layer 111 on the side wall of the trench 107 is made thin, the resistance can be made high. As a result, the leakage current between the adjacent sub-pixels (organic light emitting elements) is suppressed, and color mixing between the sub-pixels whose light emission colors are different from each other is suppressed.

Fourth Embodiment

Figure 16:
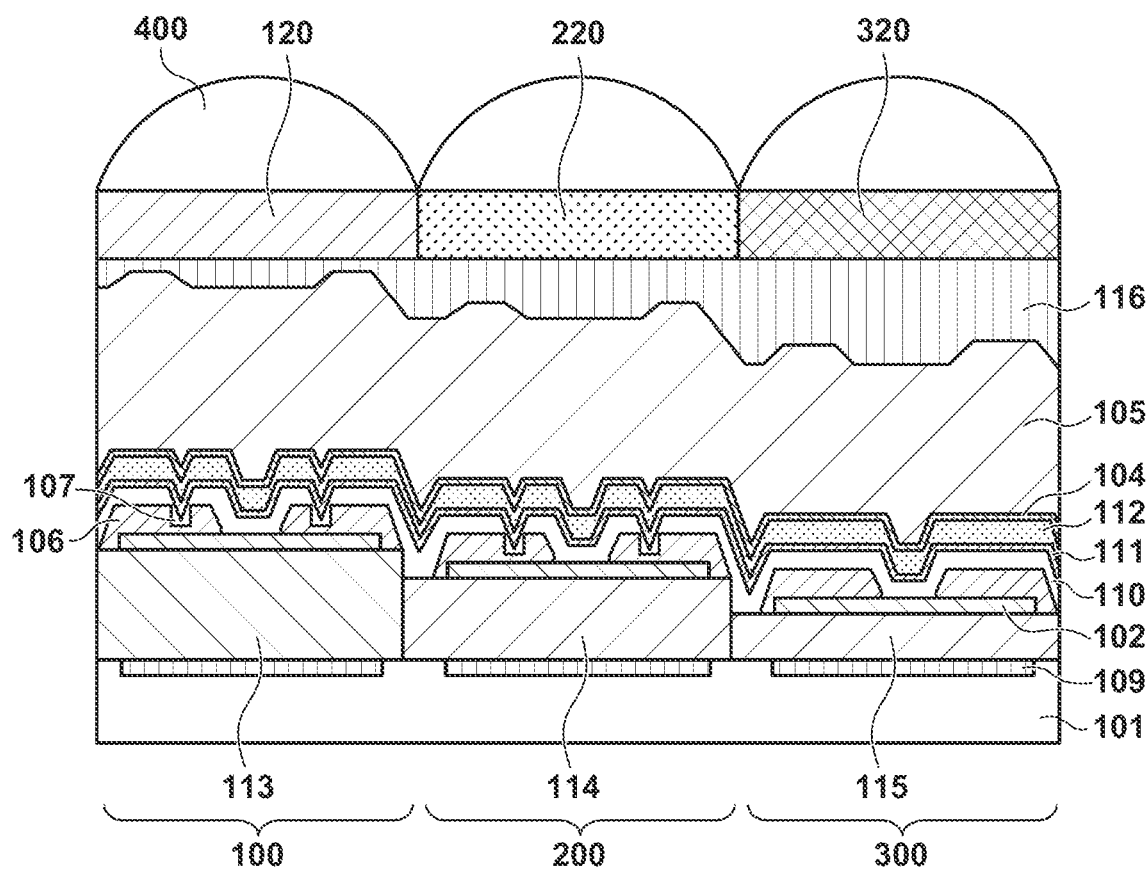
FIG. 16 is a sectional view exemplarily showing the configuration of a light emitting apparatus according to the fourth embodiment.

A light emitting apparatus 1 according to the fourth embodiment will be described below. Matters that are not mentioned as the fourth embodiment can comply with the third embodiment. The fourth embodiment may be understood as a modification of the third embodiment. FIG. 16 is a sectional view showing an example of a first sub-pixel 100, a second sub-pixel 200, and a third sub-pixel 300 of the light emitting apparatus 1 according to the fourth embodiment.

In the fourth embodiment, a color filter 120, a color filter 220, and a color filter 320 are added to the light emitting apparatus 1 according to the third embodiment. The color filter 120, the color filter 220, and the color filter 320 are arranged on a planarizing layer 116. The color filter 120, the color filter 220, and the color filter 320 are color filters that pass light beams of colors (wavelength bands) different from each other. A microlens 400 can be arranged on each of the color filter 120, the color filter 220, and the color filter 320. The microlens may simply be called a lens.

Figure 17:
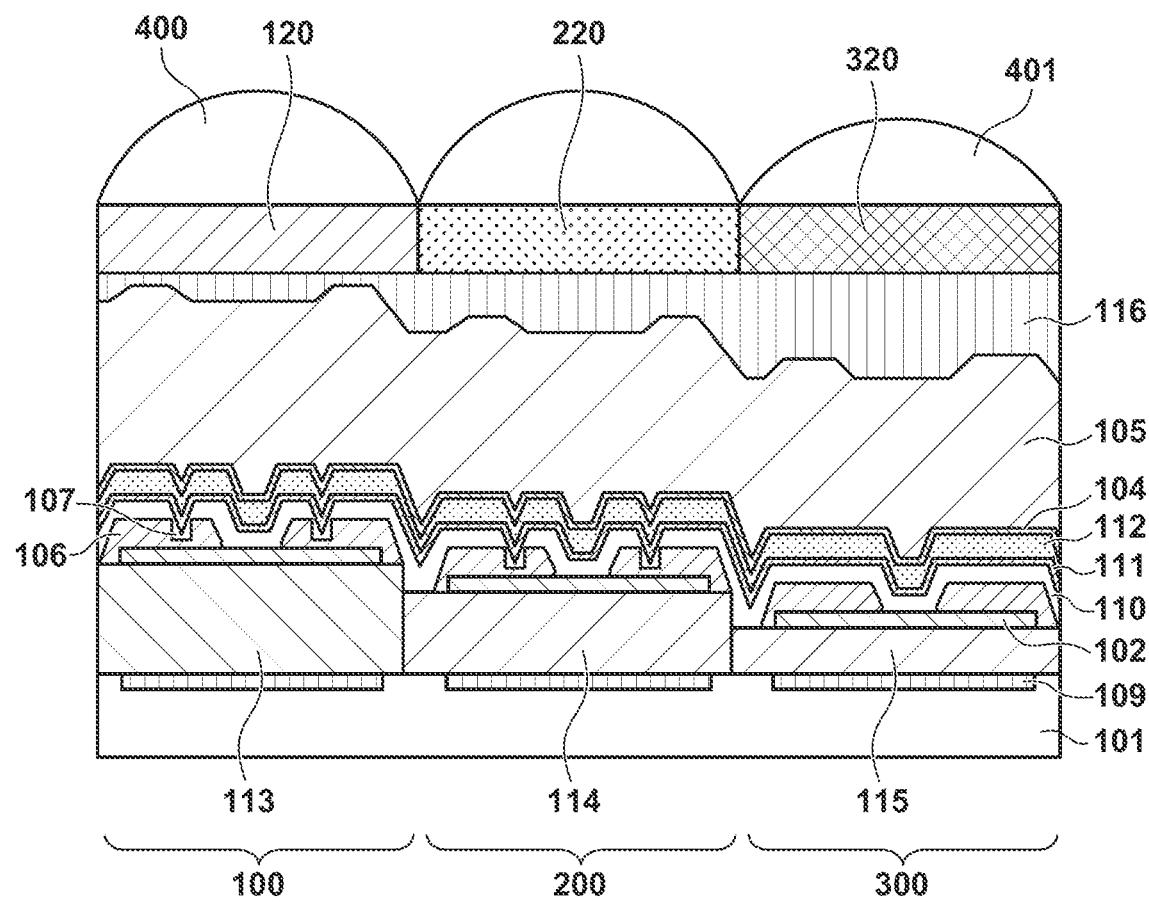
FIG. 17 is a sectional view exemplarily showing the configuration of a light emitting apparatus according to a modification of the fourth embodiment.

As shown in FIG. 17, the radius of curvature of a microlens 401 of the third sub-pixel 300 may be different from that of the microlenses 400 of the first sub-pixel 100 and the second sub-pixel 200. A light emitting region 109 of the third sub-pixel 300 may be larger than light emitting regions 108 of the first sub-pixel 100 and the second sub-pixel 200. When the radius of curvature of the microlens 401 is set to a radius of curvature according to the size of the light emitting region of the third sub-pixel 300, light can be extracted more efficiently.

In addition, to make the viewing angle characteristics of the first sub-pixel 100, the second sub-pixel 200, and the third sub-pixel 300 match, the radius of curvature of the microlens 401 may be adjusted. This is advantageous to reduce a color shift due to the dependence of luminance on the viewing angle according to each color. If the light emitting region 109 of the third sub-pixel 300 is larger than the light emitting regions 108 of the first sub-pixel 100 and the second sub-pixel 200, the radius of curvature of the microlens 401 is adjusted in accordance with this. This can reduce the difference of the dependence of luminance on the viewing angle and suppress the color shift that occurs when the viewing angle changes.

Also, the wavelength band of light of the third sub-pixel 300 may be shorter than the wavelength band of light of the first sub-pixel 100 or the second sub-pixel 200. Since the life of a light emitting layer with a short light emission wavelength is relatively short, the decrease of life can be suppressed by making the light emitting region 109 of the third sub-pixel 300 large.

Fifth Embodiment

Figure 18:
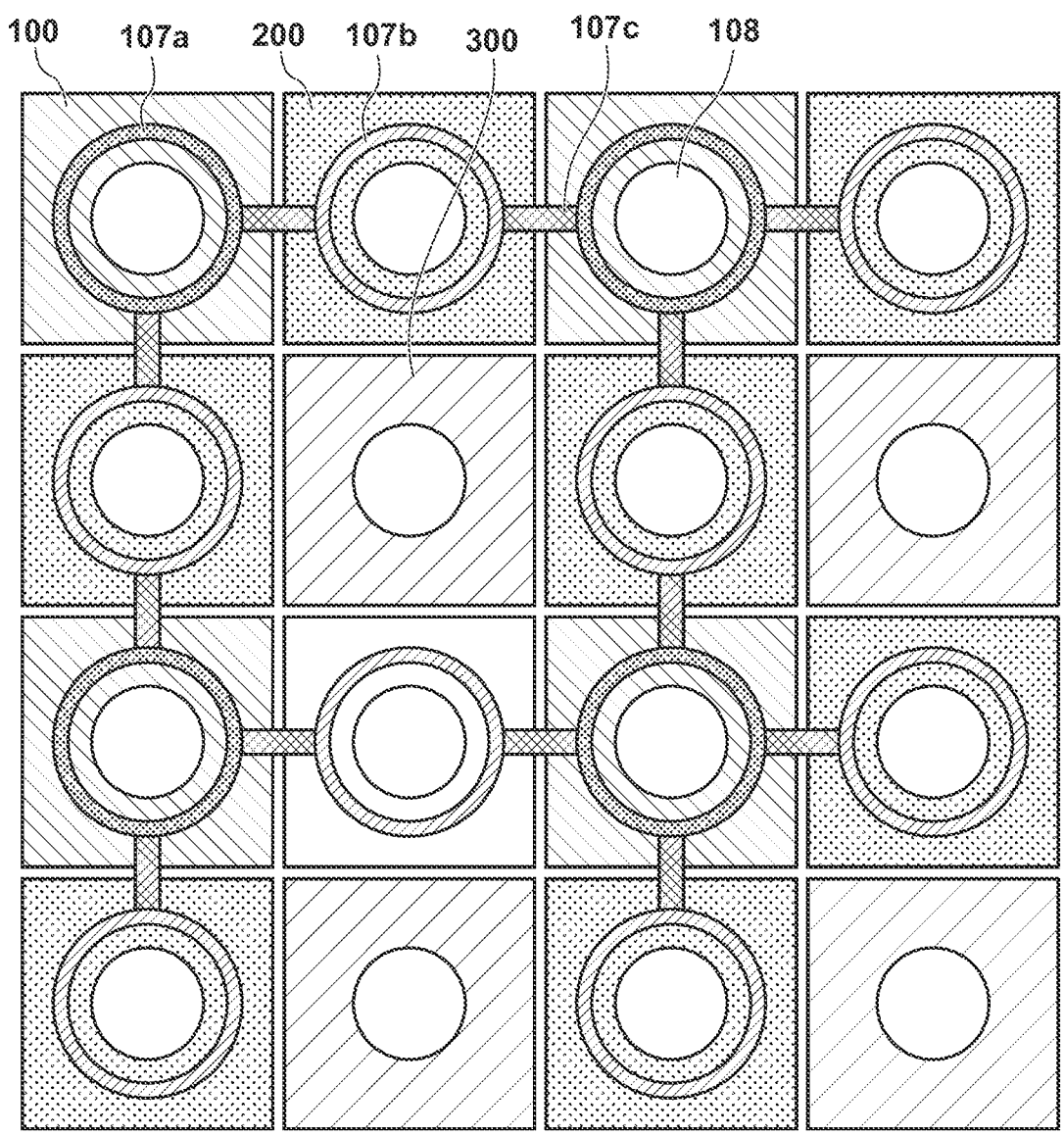
FIG. 18 is a plan view showing an example of the arrangement of a first sub-pixel, a second sub-pixel, and a third sub-pixel in a configuration example of a light emitting apparatus according to the fifth embodiment.
Figure 19:
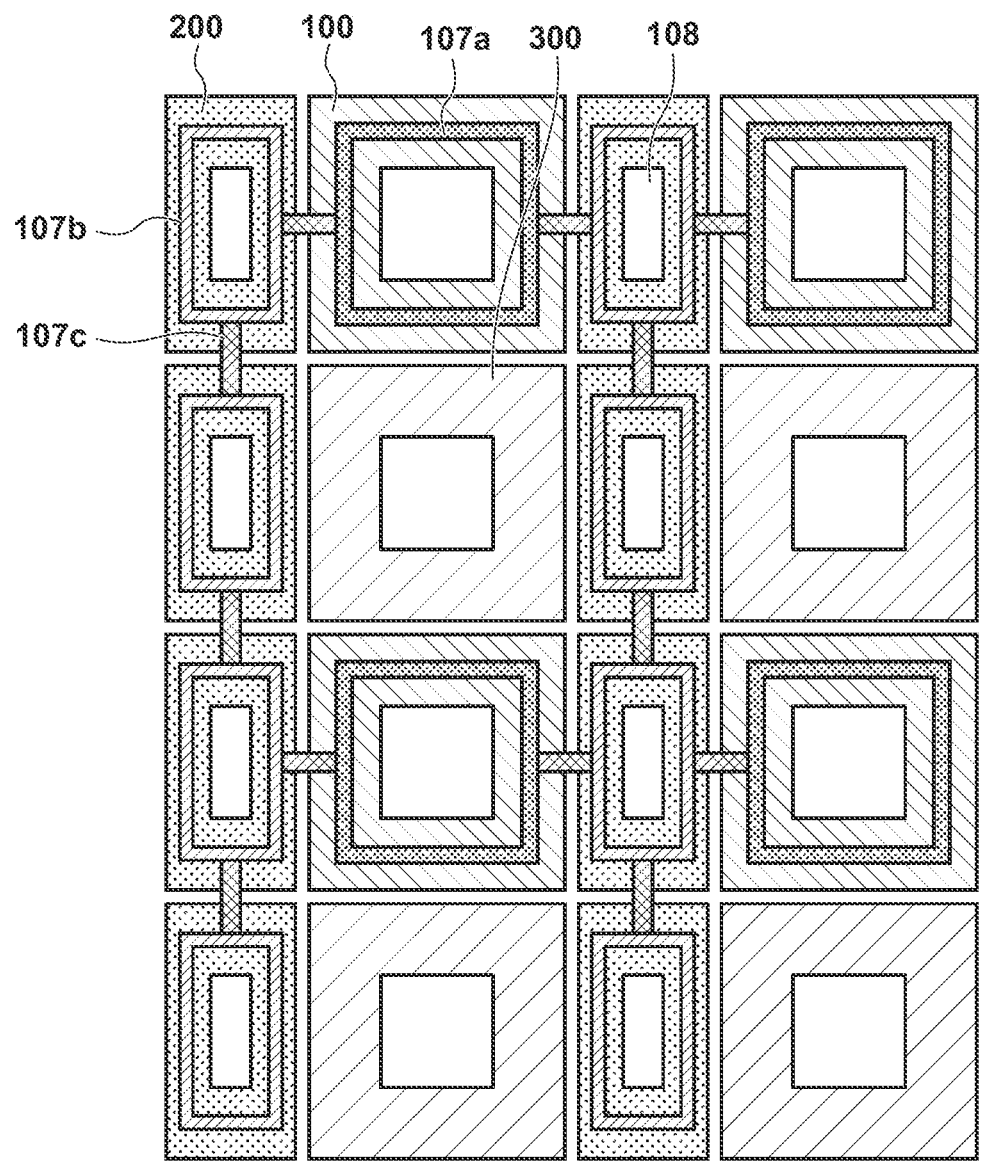
FIG. 19 is a plan view showing an example of the arrangement of a first sub-pixel, a second sub-pixel, and a third sub-pixel in another configuration example of the light emitting apparatus according to the fifth embodiment.

A light emitting apparatus 1 according to the fifth embodiment will be described below. Matters that are not mentioned as the fifth embodiment can comply with the first to fourth embodiments. The fifth embodiment may be understood as a modification of the first to fourth embodiments. FIGS. 18 and 19 are plan views showing examples of the arrangement of a first sub-pixel 100, a second sub-pixel 200, and a third sub-pixel 300 of the light emitting apparatus 1 according to the fifth embodiment.

FIG. 18 shows a Bayer arrangement, and FIG. 19 shows a pentile arrangement. As in the above-described embodiments, a trench 107a can be arranged to surround a light emitting region 108 of the first sub-pixel 100, and a trench 107b can be arranged to surround the light emitting region 108 of the second sub-pixel 200. In addition, trenches 107c can be arrand to connect the trench 107a and the trench 107b and surround the third sub-pixel 300.

Other Configurations in Embodiments

[Configuration of Organic Light Emitting Element]

An organic light emitting element is formed by arranging an insulating layer, a lower electrode, a functional layer including a light emitting layer, and an upper electrode on a substrate. A protection layer, a color filter, a microlens, and the like may be provided on the upper electrode. If a color filter is provided, a planarizing layer can be provided between the protection layer and the color filter. The planarizing layer can be made of acrylic resin or the like. The same applies to a case where a planarizing layer is provided between the color filter and the microlens.

[Substrate]

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

[Electrode]

A pair of electrodes can be used as the electrodes. The pair of electrodes can be an anode and a cathode. When an electric field is applied in the direction in which the organic light emitting element emits light, the electrode having a high potential is the anode, and the other is the cathode. It can also be said that the electrode that supplies holes to the light emitting layer is the anode, and the electrode that supplies electrons is the cathode.

As the constituent material of the anode, a material having a work function as large as possible is preferably used. For example, a metal such as gold, platinum, silver, copper, nickel, palladium, cobalt, selenium, vanadium, tungsten, aluminum, or titanium, a mixture containing some of these, or an alloy obtained by combining some of these can be used. Alternatively, a metal oxide such as tin oxide, zinc oxide, indium oxide, indium tin oxide (ITO), or zinc indium oxide may be used. Furthermore, a conductive polymer such as polyaniline, polypyrrole, or polythiophene can also be used.

One of these electrode materials may be used singly, or two or more of these may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited to these. A photolithography technique can be used to form the electrode.

On the other hand, as the constituent material of the cathode, a material having a small work function is preferably used. Examples of the material include an alkali metal such as lithium, an alkaline earth metal such as calcium, a metal such as aluminum, titanium, manganese, silver, lead, or chromium, and a mixture containing some of these. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of these may be used in combination. The cathode may have a single-layer structure or a multi-layer structure. Among others, silver is preferably used. To suppress aggregation of silver, a silver alloy is more preferably used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is preferably used since the good film coverage is provided and the resistance is easily lowered.

[Organic Compound Layer]

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first electrode and the second electrode, and may be arranged in contact with the first electrode and the second electrode.

[Protection Layer]

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by a CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness may be 50% or less, or 10% or less.

[Color Filter]

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

[Planarizing Layer]

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more preferable.

The planarizing layers may be provided above and below the color filter, and the same or different materials may be used for these. More specifically, examples of the material include polyvinyl carbazole resin, polycarbonate resin, polyester resin, ABS resin, acrylic resin, polyimide resin, phenol resin, epoxy resin, silicone resin, and urea resin.

[Microlens]

The light emitting apparatus can include an optical member such as a microlens on the light emission side. The microlens can be made of acrylic resin, epoxy resin, or the like. The microlens can aim to increase the amount of light extracted from the light emitting apparatus and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for discriminating the vertex and the middle point may be a section perpendicular to the insulating layer.

[Counter Substrate]

A counter substrate can be provided on the planarizing layer. The counter substrate is called a counter substrate because it is provided at a position corresponding to the above-described substrate. The constituent material of the counter substrate can be the same as that of the above-described substrate. When the above-described substrate is the first substrate, the counter substrate can be the second substrate.

[Organic Layer]

The functional layer including the light emitting layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to these.

One of these binder resins may be used singly as a homopolymer or a copolymer, or two or more of these may be used in combination. Furthermore, additives such as a well-known plasticizer, antioxidant, and an ultraviolet absorber may also be used as needed.

[Pixel Circuit]

The light emitting apparatus may include a pixel circuit connected to the light emitting element. The pixel circuit may be an active matrix circuit that individually controls light emission of the first light emitting element and the second light emitting element. The active matrix circuit may be a voltage or current programming circuit. A driving circuit includes a pixel circuit for each pixel. The pixel circuit may include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting apparatus includes a display region and a peripheral region arranged around the display region. The light emitting apparatus includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

In accordance with the size of the light emission region, the magnitude of a driving current can be decided. More specifically, when causing the first light emitting element and the second light emitting element to emit light with the same luminance, the current value flowing through the first light emitting element may be smaller than that flowing through the second light emitting element. This is because the light emission region is small and thus a necessary current may be small.

[Pixel]

The light emitting apparatus includes a plurality of pixels. Each pixel includes sub-pixels that emit light components of different colors. The sub-pixels have, for example, R, G, and B emission colors, respectively.

In each pixel, a region also called a pixel opening emits light. This region is the same as the first region. The pixel opening can have a size of 5 µm (inclusive) to 15 µm (inclusive). More specifically, the pixel opening can have a size of 11 µm, 9.5 µm, 7.4 µm, 6.4 µm, or the like.

A distance between the sub-pixels can be 10 µm or less, and can be, more specifically, 8 µm, 7.4 µm, or 6.4 µm.

The pixels can have a known arrangement form in a plan view. For example, the pixels may have a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

Other Embodiments

Figure 20:
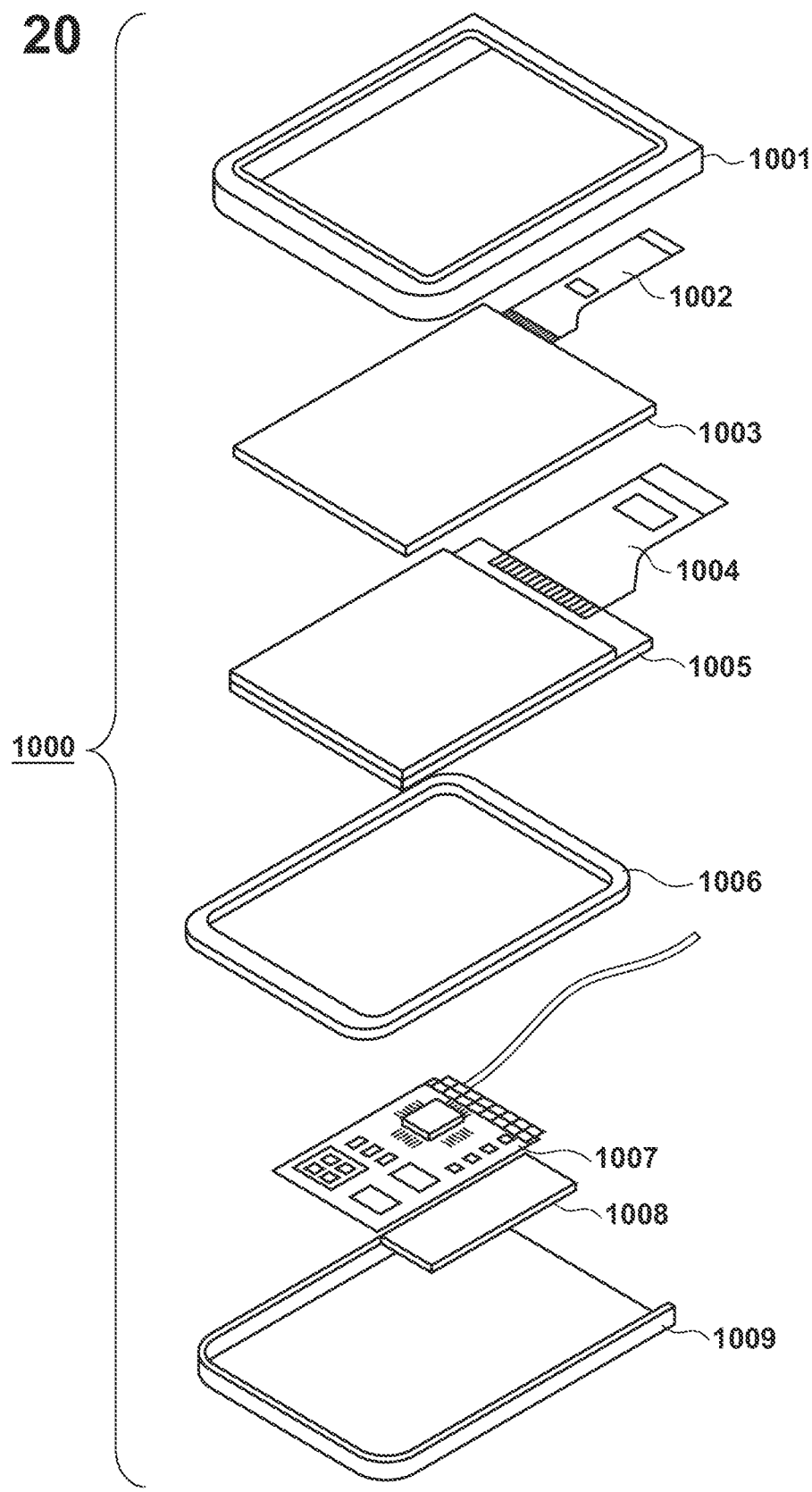
FIG. 20 is a view showing still another embodiment.

FIG. 20 is a schematic view showing an example of the display device according to this embodiment. A display device 1000 can include a touch panel 1003, a display panel 1005, a frame 1006, a circuit board 1007, and a battery 1008 between an upper cover 1001 and a lower cover 1009. The light emitting apparatus according to each embodiment described above can be applied to the display panel 1005. Flexible printed circuits (FPCs) 1002 and 1004 are respectively connected to the touch panel 1003 and the display panel 1005. Transistors are printed on the circuit board 1007. The battery 1008 is unnecessary if the display device is not a portable apparatus. Even when the display device is a portable apparatus, the battery 1008 may be arranged at another position.

The display device according to this embodiment can include color filters of red, green, and blue. The color filters of red, green, and blue can be arranged in a delta array.

The display device according to this embodiment can also be used for a display unit of a portable terminal. At this time, the display unit can have both a display function and an operation function. Examples of the portable terminal are a portable phone such as a smartphone, a tablet, and a head mounted display.

The display device according to this embodiment can be used for a display unit of an image capturing device including an optical unit having a plurality of lenses, and an image sensor for receiving light having passed through the optical unit. The image capturing device can include a display unit for displaying information acquired by the image sensor. In addition, the display unit can be either a display unit exposed outside the image capturing device, or a display unit arranged in the finder. The image capturing device can be a digital camera or a digital video camera.

Figure 21A:
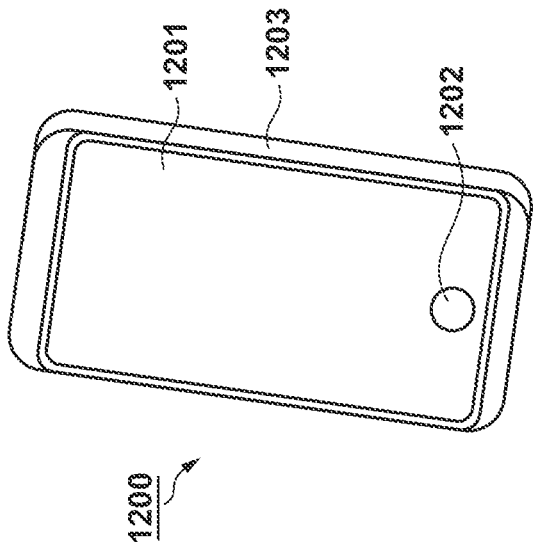
FIGS. 21A and 21B are views showing still another embodiment.

FIG. 21A is a schematic view showing an example of the image capturing device according to this embodiment. An image capturing device 1100 can include a viewfinder 1101, a rear display 1102, an operation unit 1103, and a housing 1104. The light emitting apparatus according to each embodiment described above can be applied to the viewfinder 1101. In this case, the display device can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time, so the information is preferably displayed as soon as possible. Therefore, the display device using the organic light emitting element of the present invention is preferably used. This is so because the organic light emitting element has a high response speed. The display device using the organic light emitting element can be used for the apparatuses that require a high display speed more preferably than for the liquid crystal display device.

The image capturing device 1100 includes an optical unit (not shown). This optical unit includes a plurality of lenses, and forms an image on an image sensor that is accommodated in the housing 1104. The focal points of the plurality of lenses can be adjusted by adjusting the relative positions. This operation can also automatically be performed. The image capturing device may be called a photoelectric conversion device. Instead of sequentially capturing an image, the photoelectric conversion device can include, as an image capturing method, a method of detecting the difference from a previous image, a method of extracting an image from an always recorded image, or the like.

Figure 21B:
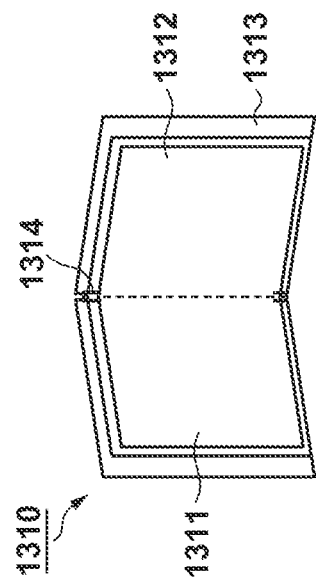

FIG. 21B is a schematic view showing an example of an electronic apparatus according to this embodiment. An electronic apparatus 1200 includes a display unit 1201, an operation unit 1202, and a housing 1203. The light emitting apparatus according to each embodiment described above can be applied to the display unit 1201. The housing 1203 can accommodate a circuit, a printed board including this circuit, a battery, and a communication unit. The operation unit 1202 may be a button or a touch-panel-type reaction unit. The operation unit may also be a biometric authentication unit that performs unlocking or the like by authenticating a fingerprint. The electronic apparatus including the communication unit can also be regarded as a communication apparatus. The electronic apparatus can further have a camera function by including a lens and an image sensor. An image captured by the camera function is displayed on the display unit. Examples of the electronic apparatus are a smartphone and a laptop computer.

Figure 22A:
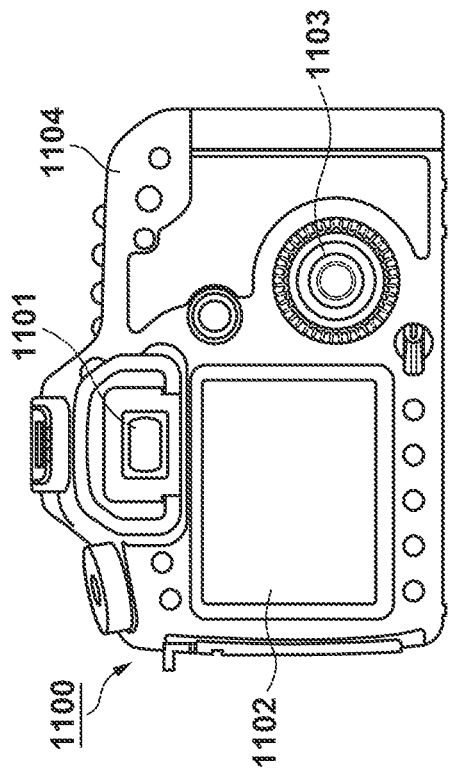
FIGS. 22A and 22B are views showing still another embodiment.
Figure 22B:
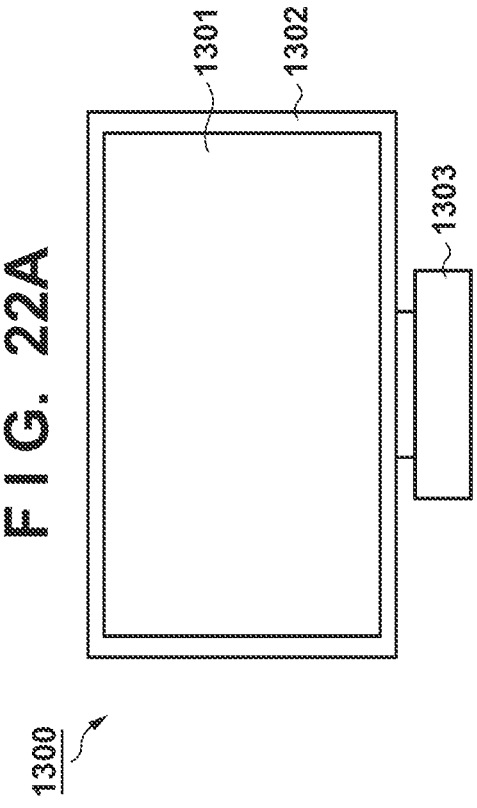

FIGS. 22A and 22B are schematic views showing examples of the display device according to this embodiment. FIG. 22A shows a display device such as a television monitor or a PC monitor. A display device 1300 includes a frame 1301 and a display unit 1302. The light emitting apparatus according to each embodiment described above can be applied to the display unit 1302.

The display device 1300 includes a base 1303 that supports the frame 1301 and the display unit 1302. The base 1303 is not limited to the form shown in FIG. 22A. The lower side of the frame 1301 may also function as the base.

In addition, the frame 1301 and the display unit 1302 may be bent. The radius of curvature can be 5,000 mm (inclusive) to 6,000 mm (inclusive).

FIG. 22B is a schematic view showing another example of the display device according to this embodiment. A display device 1310 shown in FIG. 22B is configured to be foldable, that is, the display device 1310 is a so-called foldable display device. The display device 1310 includes a first display unit 1311, a second display unit 1312, a housing 1313, and a bending point 1314. The light emitting apparatus according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 23A:
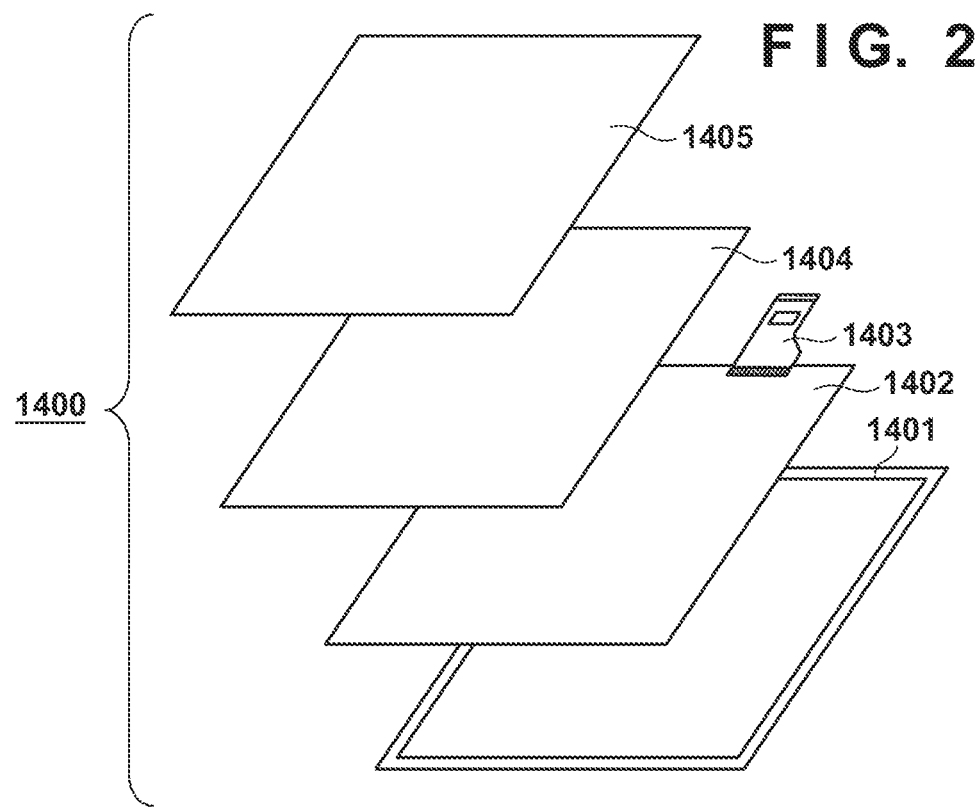
FIGS. 23A and 23B are views showing still another embodiment.

FIG. 23A is a schematic view showing an example of the illumination device according to this embodiment. An illumination device 1400 can include a housing 1401, a light source 1402, a circuit board 1403, an optical film 1404, and a light-diffusing unit 1405. The light emitting apparatus according to each embodiment described above can be applied to the light source 1402. The optical film can be a filter that improves the color rendering of the light source. When performing lighting-up or the like, the light-diffusing unit can throw the light of the light source over a broad range by effectively diffusing the light. The optical film and the light-diffusing unit can be provided on the illumination light emission side. The illumination device can also include a cover on the outermost portion, as needed.

The illumination device is, for example, a device for illuminating the interior of the room. The illumination device can emit light of an arbitrary color such as white light or natural white light. The illumination device can also include a light control circuit for controlling these light components. The illumination device can also include the organic light emitting element according to the present invention and a power supply circuit connected to the organic light emitting element. The power supply circuit is a circuit for converting an AC voltage into a DC voltage. White has a color temperature of 4,200 K, and natural white has a color temperature of 5,000 K. The illumination device may also include a color filter.

In addition, the illumination device according to this embodiment may include a heat radiation unit. The heat radiation unit radiates the internal heat of the device to the outside of the device, and examples are a metal having a high specific heat and liquid silicon.

Figure 23B:
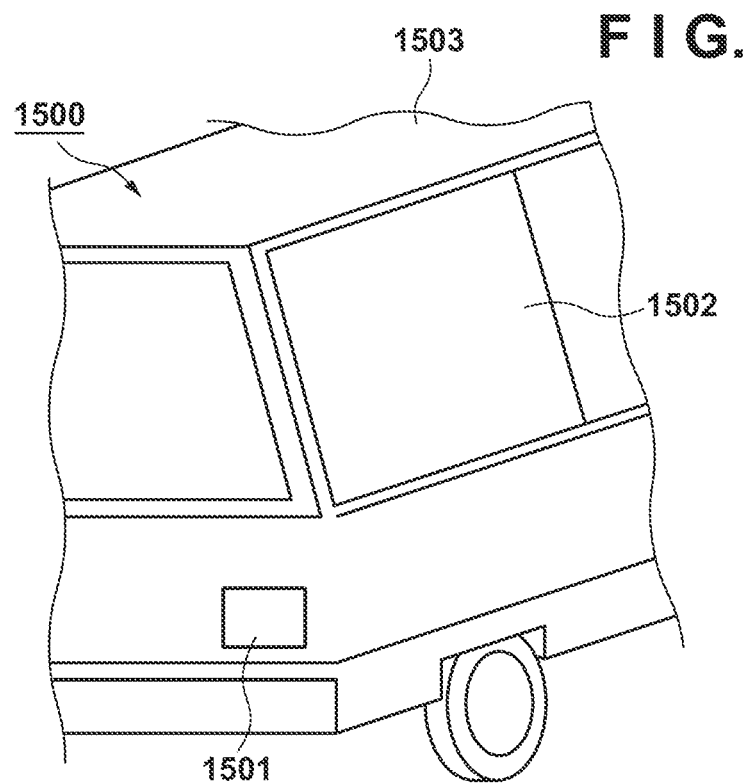

FIG. 23B is a schematic view of an automobile as an example of a moving body according to this embodiment. The automobile has a taillight as an example of the lighting appliance. An automobile 1500 has a taillight 1501, and can have a form in which the taillight is turned on when performing a braking operation or the like.

The light emitting apparatus according to each embodiment described above can be applied to the taillight 1501. The taillight can include a protection member for protecting the organic EL element. The material of the protection member is not limited as long as the material is a transparent material with a strength that is high to some extent, and is preferably polycarbonate. A furandicarboxylic acid derivative, an acrylonitrile derivative, or the like may be mixed in polycarbonate.

The automobile 1500 can include a vehicle body 1503, and a window 1502 attached to the vehicle body 1503. This window may be a window for checking the front and back of the automobile, and can also be a transparent display. This transparent display can include the organic light emitting element according to this embodiment. In this case, the constituent materials of the electrodes and the like of the organic light emitting element are preferably formed by transparent members.

The moving body according to this embodiment can be a ship, an airplane, a drone, or the like. The moving body can include a main body and a lighting appliance provided on the main body. The lighting appliance can emit light for making a notification of the position of the main body. The lighting appliance includes the organic light emitting element according to this embodiment.

An application example of the display device according to each embodiment described above will be described with reference to FIGS. 24A and 24B. The display device can be applied to a system that can be worn as a wearable device such as smartglasses, an HMD, or a smart contact lens. An image capturing display device used in such an application example includes an image capturing device capable of photoelectrically converting visible light and a display device capable of emitting visible light.

Figure 24A:
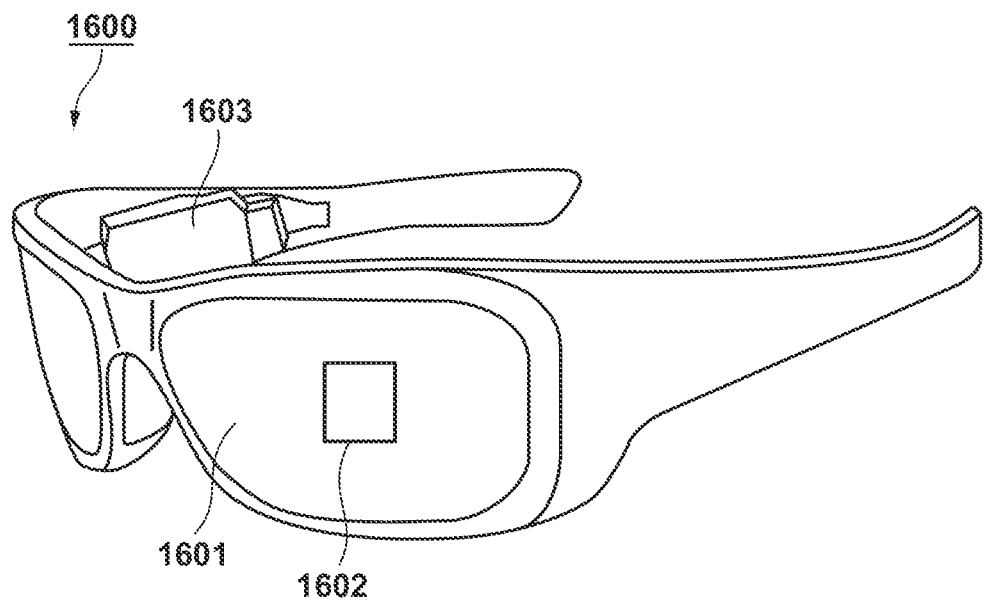
FIGS. 24A and 24B are views showing still another embodiment.

Glasses 1600 (smartglasses) according to one application example will be described with reference to FIG. 24A. An image capturing device 1602 such as a CMOS sensor or an SPAD is provided on the surface side of a lens 1601 of the glasses 1600. In addition, the display device of each of the above-described embodiments is provided on the back surface side of the lens 1601.

The glasses 1600 can further include a control device 1603. The control device 1603 functions as a power supply that supplies power to the image capturing device 1602 and the display device according to each embodiment. In addition, the control device 1603 controls the operations of the image capturing device 1602 and the display device. An optical system configured to condense light to the image capturing device 1602 is formed on the lens 1601.

Figure 24B:
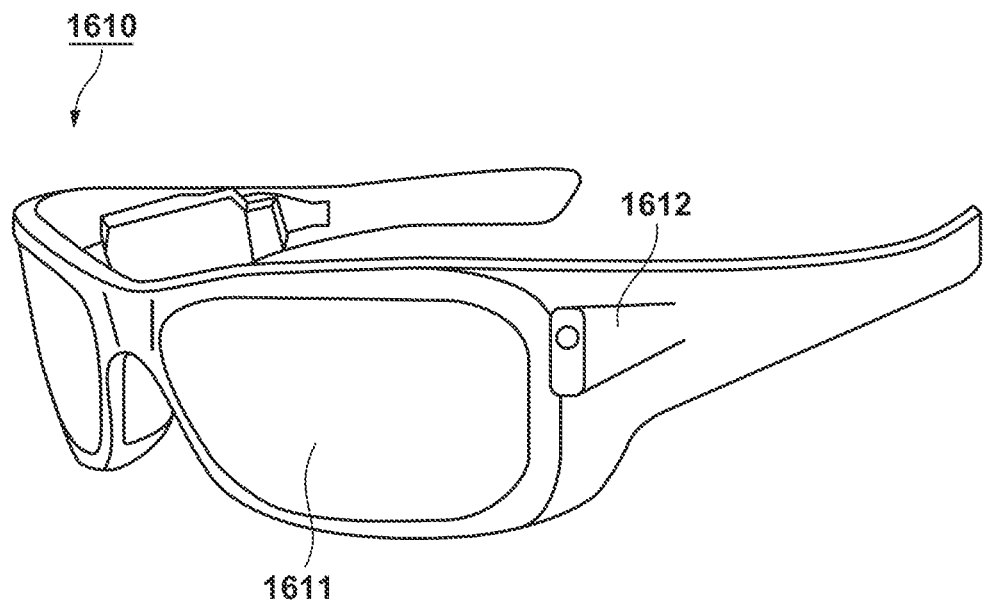

Glasses 1610 (smartglasses) according to one application example will be described with reference to FIG. 24B. The glasses 1610 includes a control device 1612, and an image capturing device corresponding to the image capturing device 1602 and a display device are mounted on the control device 1612. The image capturing device in the control device 1612 and an optical system configured to project light emitted from the display device are formed in a lens 1611, and an image is projected to the lens 1611. The control device 1612 functions as a power supply that supplies power to the image capturing device and the display device, and controls the operations of the image capturing device and the display device. The control device may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display device according to the embodiment of the present invention may include an image capturing device including a light receiving element, and a displayed image on the display device may be controlled based on the line-of-sight information of the user from the image capturing device.

More specifically, the display device decides a first visual field region at which the user is gazing and a second visual field region other than the first visual field region based on the line-of-sight information. The first visual field region and the second visual field region may be decided by the control device of the display device, or those decided by an external control device may be received. In the display region of the display device, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the display device, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can preferably be applied. The smartglasses can display captured outside information in real time.

As described above, when the light emitting apparatus according to this embodiment is used, it is possible to perform display with high image quality stably even for long time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-069596, filed Apr. 20, 2022, and Japanese Patent Application No. 2022-212107, filed Dec. 28, 2022, which are hereby incorporated by reference herein in their entirety.

What is claimed is:

1. A light emitting apparatus comprising a plurality of sub-pixels including a first sub-pixel, a second sub-pixel, and a third sub-pixel, in which one sub-pixel of the first sub-pixel, the second sub-pixel, and the third sub-pixel is adjacent to the remaining two sub-pixels,
wherein each of the plurality of sub-pixels includes a lower electrode, a bank including an opening that exposes a center portion of the lower electrode, an organic compound layer arranged to cover the lower electrode and the bank and including a light emitting layer, and an upper electrode arranged on the organic compound layer,
the bank of the first sub-pixel includes a first separation structure that at least partially surrounds the opening arranged on the lower electrode of the first sub-pixel, and
the bank of the third sub-pixel does not include a separation structure arranged to surround the opening of the third sub-pixel.

2. The apparatus according to claim 1, wherein the bank of the second sub-pixel includes a second separation structure that at least partially surrounds the opening arranged on the lower electrode of the second sub-pixel.

3. The apparatus according to claim 1, wherein the opening of the third sub-pixel is larger than the opening of the first sub-pixel and the opening of the second sub-pixel.

4. The apparatus according to claim 1, wherein
the first separation structure is arranged on the lower electrode of the first sub-pixel, and
the second separation structure is arranged on the lower electrode of the second sub-pixel.

5. The apparatus according to claim 1, wherein the first separation structure and the second separation structure include a portion arranged between the first sub-pixel and the second sub-pixel.

6. The apparatus according to claim 1, wherein the bank of the third sub-pixel is arranged apart from the bank of the first sub-pixel and the bank of the second sub-pixel.

7. The apparatus according to claim 1, wherein the bank of the third sub-pixel does not include a separation structure arranged to surround the third sub-pixel between the opening of the third sub-pixel and another sub-pixel that is adjacent to the third sub-pixel and is arranged to surround the third sub-pixel.

8. The apparatus according to claim 1, wherein the first separation structure surrounds a whole circumference of the opening of the first sub-pixel.

9. The apparatus according to claim 1, wherein the first separation structure partially surrounds the opening of the first sub-pixel.

10. The apparatus according to claim 1, further comprising a connecting separation structure extending to connect the first separation structure and the second separation structure.

11. The apparatus according to claim 10, wherein the connecting separation structure is connected to none of the opening of the first sub-pixel, the opening of the second sub-pixel, and the opening of the third sub-pixel.

12. The apparatus according to claim 10, wherein the connecting separation structure connects the first separation structure and the second separation structure to surround the opening of the third sub-pixel.

13. The apparatus according to claim 1, wherein the organic compound layer includes a plurality of light emitting layers, and a charge generation layer arranged between the plurality of light emitting layers.

14. The apparatus according to claim 1, wherein
each of the first sub-pixel, the second sub-pixel, and the third sub-pixel includes a lens,
in the first sub-pixel, the first separation structure is arranged between the lens and the lower electrode, and
in the second sub-pixel, the second separation structure is arranged between the lens and the lower electrode.

15. The apparatus according to claim 14, wherein a radius of curvature of the lens of the third sub-pixel is different from a radius of curvature of at least one of the lens of the first sub-pixel and the lens of the second sub-pixel.

16. The apparatus according to claim 1, wherein a wavelength of light generated by the third sub-pixel is shorter than a wavelength of light generated by the first sub-pixel.

17. A display device comprising a light emitting apparatus defined in claim 1.

18. A photoelectric conversion device comprising an optical unit including a plurality of lenses, an image sensor configured to receive light having passed through the optical unit, and a display unit configured to display an image captured by the image sensor,
wherein the display unit includes a light emitting apparatus defined in claim 1.

19. An electronic apparatus comprising:
a display unit including a light emitting apparatus defined in claim 1;
a housing provided with the display unit; and
a communication unit provided in the housing and configured to perform external communication.

20. An illumination device comprising:
a light source including a light emitting apparatus defined in claim 1; and
a light-diffusing unit or an optical film configured to pass light generated by the light source.

21. A moving body comprising:
a lighting appliance including a light emitting apparatus defined in claim 1; and
a main body provided with the lighting appliance.

* * * * *